(12) United States Patent
Matsumoto et al.

(10) Patent No.: US 6,563,850 B1
(45) Date of Patent: *May 13, 2003

(54) LIGHT-EMITTING DEVICE AND FABRICATING METHOD THEREOF

(75) Inventors: Mitsuhiro Matsumoto, Kashihara (JP); Masaki Tatsumi, Tenri (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/167,221

(22) Filed: Oct. 6, 1998

(30) Foreign Application Priority Data

Oct. 6, 1997 (JP) .............................. 9-273163
Mar. 19, 1998 (JP) ........................... 10-070859

(51) Int. Cl.[7] ................................ H01S 5/00
(52) U.S. Cl. ................ 372/45; 372/43; 372/44
(58) Field of Search ................ 372/45, 43, 44

(56) References Cited

U.S. PATENT DOCUMENTS

| | | | |
|---|---|---|---|
| 4,679,199 A | | 7/1987 | Olshansky |
| 5,727,015 A | * | 3/1998 | Takahashi et al. ............ 372/96 |
| 6,118,800 A | * | 9/2000 | Kidoguchi et al. ........... 372/46 |
| 6,195,374 B1 | | 2/2001 | Kidoguchi et al. |
| 6,242,761 B1 | * | 6/2001 | Fujimoto et al. ............ 257/94 |

FOREIGN PATENT DOCUMENTS

| | | |
|---|---|---|
| EP | 0 661 782 A1 | 7/1995 |
| EP | 0 802 442 A1 | 10/1997 |
| EP | 0 847 117 A1 | 6/1998 |
| JP | 03-270186 | 12/1991 |
| JP | 04-049691 | 2/1992 |
| JP | 04-074487 | 3/1992 |
| JP | 4-67354 | 10/1992 |
| JP | 04-350988 | 12/1992 |
| JP | 05-110185 | 4/1993 |
| JP | 05-291686 | 11/1993 |
| JP | 06-045698 | 2/1994 |
| JP | 06252508 A | 9/1994 |
| JP | 07-193321 | 7/1995 |
| JP | 07-235732 | 9/1995 |
| JP | 07-288338 | 10/1995 |

(List continued on next page.)

OTHER PUBLICATIONS

Mikulla, M. et al., (Aug. 28, 1995 "High power tapered inGaAs/GaAs laser diodes with carbon doped cladding layers grown by solid source molecular beam epitaxy" Compound semiconductors 1995, Proceedings of the 22nd International Symposium on Compound Semiconductors, Cheju Island, Korea, *Inst. Phys. Conf. Ser.* 145:995–998.

Ralston, J.D. et al., (Nov. 20, 1993) "p–Dopant incorporation and influence on gain and damping behaviour in high-speed GaAs–based strained MQW lasers" *Materials Science & Engineering B*, Elsevier Sequoia, Lausanne, CH, B21(2/3):232–236.

*Primary Examiner*—Paul Ip
*Assistant Examiner*—Cornelius H Jackson
(74) *Attorney, Agent, or Firm*—Morrison & Foerster LLP

(57) ABSTRACT

A light-emitting device includes a first guide layer; a second guide layer; and an active layer interposed between the first guide layer and the second guide layer. The active layer has a multiple quantum well structure including a plurality of quantum well layers and a quantum barrier layer interposed between the adjacent quantum well layers. The first guide layer and the second guide layer are disposed to be adjacent to the quantum well layers. The first guide layer and the second guide layer have a forbidden band width which is larger than a forbidden band width of the quantum well layers. The forbidden band width of at least one of the first guide layer and the second guide layer is smaller than a forbidden band width of the quantum barrier layer.

24 Claims, 24 Drawing Sheets

FOREIGN PATENT DOCUMENTS

| | | |
|---|---|---|
| JP | 07-297487 | 11/1995 |
| JP | 08-018168 | 1/1996 |
| JP | 08125263 A | 5/1996 |
| JP | 08-321633 | 12/1996 |
| JP | 09-129926 | 5/1997 |
| JP | 09-186397 | 7/1997 |
| JP | 09-219558 | 8/1997 |
| JP | 10-163561 | 6/1998 |
| WO | WO 97/13303 A1 | 4/1997 |

* cited by examiner

LIGHT-EMITTING DEVICE AND FABRICATING METHOD THEREOF

BACKGROUND OF THE INVENTION

1. Field of the Invention

The present invention relates to a semiconductor light-emitting device such as, for example, a semiconductor laser or a light emitting diode, and a method for fabricating the same. Alternatively, the present invention relates to a semiconductor laser usable as a light source in the fields of, for example, optical disks, laser beam printers and optical transmission, and especially relates to a semiconductor laser having an active layer of a multiple quantum well structure.

2. Description of the Related Art

As a conventional semiconductor laser, a quantum well type laser, including a quantum well layer as an active layer acting as a light emitting section, is known in the art. The quantum well type laser has various advantages including a lower operating current and improved noise characteristic. The quantum well type laser can have a separate confinement heterostructure (hereinafter, referred to as the "SCH structure") for enhancing light confinement into the active layer.

In general, the forbidden band width a compound semiconductor layer and the refractive index thereof are in reverse proportion to each other. On the other hand, the Al mole fraction of a compound semiconductor layer containing Al and the forbidden band width thereof are typically in proportion to each other. Accordingly, the band diagram of the active layer and the vicinity thereof of a quantum well type laser having the SCH structure is, for example, as shown in FIG. 23.

A semiconductor laser having the band diagram shown in FIG. 23 includes a multiple quantum well (hereinafter, referred to as "MQW") active layer 1501 which includes a plurality of quantum wells 1510 and a plurality of barrier layers 1511, and also includes a first optical guide layer 1502 and a second optical guide layer 1503 which interpose the active layer 1501 therebetween. Each of the first optical guide layer 1502 and the second optical guide layer 1503 has a larger forbidden band width than that of the quantum well layers 1510. The semiconductor laser further includes an n-type first cladding layer 1504 and a p-type second cladding layer 1505 which interpose the first and second optical guide layer 1502 and 1503 therebetween. Each of the n-type first cladding layer 1504 and the p-type second cladding layer 1505 have a larger forbidden band width than that of the first and second optical guide layers 1502 and 1503. In the semiconductor laser having such a structure, carrier confinement is established by the quantum well layers 1510, while light confinement is established by the first optical guide layer 1502 and the second optical guide layer 1503.

Such a semiconductor laser having the SCH structure is disclosed in, for example, Japanese Patent Publication for Opposition No. 4-67354 and Japanese Laid-Open Patent Publication No. 6-252508. The semiconductor laser disclosed in Japanese Patent Publication for Opposition No. 4-67354 contains impurities in the entire optical guide layers, while the semiconductor laser disclosed in Japanese Laid-Open Patent Publication No. 6-252508 contains no impurities in the optical guide layers.

The semiconductor laser disclosed in Japanese Patent Publication for Opposition No. 4-67354 includes an MQW active layer including a plurality of quantum well layers each having a thickness of no greater than the de Brogli wavelength of electrons, i.e., a thickness of about 20 nm or less. Referring to FIG. 24, such a semiconductor laser 1700 includes an n-type GaAs buffer layer 1702, an n-type AlGaAs cladding layer 1703, an n-type AlGaAs guide layer 1704, an MQW active layer 1705, a p-type AlGaAs guide layer 1706, a p-type AlGaAs cladding layer 1707, and a p-type GaAs cap layer 1708, which are formed on an n-type GaAs substrate 1701 in the above order.

FIG. 25 is an energy band diagram of the MQW active layer 1705 and the vicinity thereof. As shown in FIG. 25, the MQW active layer 1705 includes a plurality of GaAs quantum well layers 1710 and a plurality of AlGaAs quantum barrier layers 1711 each interposed between two adjacent quantum well layers 1710. In the example shown in FIG. 25, the MQW active layer 1705 includes three GaAs quantum well layers 1710 and two AlGaAs quantum barrier layers 1711 provided alternately.

The forbidden band width of each of the n-type AlGaAs guide layer 1704 and the p-type AlGaAs guide layer 1706 is set to be equal to the forbidden band width of the quantum barrier layers 1711. By setting the forbidden band widths of the AlGaAs guide layers 1704 and 1706 and the quantum barrier layers 1711 at the same value, the quantum well layers 1710 are all interposed between two semiconductor layers having the same width forbidden band width. Thus, the dispersion of the quantization level is reduced among the quantum well layers 1710, which leads to a narrower light emitting spectrum. Accordingly, the threshold current is lowered.

Recently, a further reduction in the threshold current of semiconductor lasers has been demanded. In order to further reduce the threshold current in the semiconductor laser 1700, the light confinement ratio into the quantum well layers 1710 of the MQW active layer 1705 is required to be raised. In the SCH structure, the light confinement ratio can be raised to reduce the threshold current by increasing the thickness of the optical guide layers 1704 and 1706. Accordingly, it is desirable to increase the thickness of the optical guide layers in order to reduce the threshold current.

However, thicker optical guide layers cause the following problems.

In general, a dopant concentration of the optical guide layer is set to be significantly lower than that of the cladding layer (alternatively, no doping is performed into the optical guide layer) in order to suppress the dopant diffusion from the optical guide layer to the MQW active layer. Accordingly, thicker optical guide layers increase the resistance of the semiconductor laser in the optical guide layer, resulting in an increased operating voltage. As can be appreciated, the thicker optical guide layer according to the conventional technology causes the device characteristics to be deteriorated due to an increased operating voltage, while a reduced threshold current can be realized thereby.

In the semiconductor laser 1700, the forbidden band width of the optical guide layers 1704 and 1706 is set to be equal to the forbidden band width of the quantum barrier layers 1711. Such setting corresponds to setting the Al mole fraction of the optical guide layers 1704 and 1706 to substantially as high as the Al mole fraction of the quantum barrier layer 1711. Accordingly, the dopant in the cladding layers 1703 and 1707 may be diffused to the MQW active layer 1705, whereby the Al mole fraction of the quantum well layers 1710 is likely to change. As a result, the oscillating wavelength is shifted from the designed value, resulting in difficulty in controlling the oscillating wavelength.

In the case of the semiconductor laser disclosed in Japanese Laid-Open Patent Publication No. 6-252508 which does not contain impurities in the optical guide layer, the thicker optical guide layer causes an increased resistance thereof. In addition, there occurs a potential barrier between the cladding layer and the optical guide layer, thereby raising the operating voltage.

In the case of the semiconductor laser 1700 disclosed in Japanese Patent Publication for Opposition No. 4-67354 containing impurities in the optical guide layers 1704 and 1706, the impurities are diffused from the optical guide layers 1704 and 1706 to the MQW active layer 1705 during activation of the semiconductor laser 1700. Accordingly, a non-emission recombination center is formed in the MQW active layer 1705, resulting in an inner absorption loss. Thus, characteristics of the semiconductor laser 1700 are deteriorated.

Moreover, the details of influences on the laser characteristics caused by impurity injection into semiconductor layers, such as optical guide layers, which are adjacent to the active layer have not received much study.

The above-described problems are also applied to semiconductor lasers other than those of the quantum well type, and also to light emitting diodes including cladding layers interposing an active layer.

SUMMARY OF THE INVENTION

A light-emitting device of the present invention includes: a first guide layer; a second guide layer; and an active layer interposed between the first guide layer and the second guide layer. The active layer having a multiple quantum well structure including a plurality of quantum well layers and a quantum barrier layer interposed between the adjacent quantum well layers. The first guide layer and the second guide layer are disposed to be adjacent to the quantum well layers. The first guide layer and the second guide layer have a forbidden band width which is larger than a forbidden band width of the quantum well layers. The forbidden band width of at least one of the first guide layer and the second guide layer is smaller than a forbidden band width of the quantum barrier layer.

In one embodiment, the device further includes: a first cladding layer having a first conductivity type and a second cladding layer having a second conductivity type, the first cladding layer and the second cladding layer interposing the first guide layer and the second guide layer; and a saturable absorption layer provided between the first cladding layer and the second cladding layer, the saturable absorption layer having a light emitting energy of a level substantially equal to an energy of a laser oscillation light of the active layer.

In another embodiment, the device further includes: a first cladding layer having a first conductivity type and a second cladding layer having a second conductivity type, the first cladding layer and the second cladding layer interposing the first guide layer and the second guide layer; a third cladding layer having the second conductivity type and provided outside the second cladding layer, the third cladding layer being disposed on the opposite side to the first cladding layer with respect to the second cladding layer; and a saturable absorption layer provided between the first cladding layer and the third cladding layer, the saturable absorption layer having a light emitting energy of a level substantially equal to an energy of a laser oscillation light of the active layer.

In still another embodiment, the device further includes: a first cladding layer having a first conductivity type and a second cladding layer having a second conductivity type, the first cladding layer and the second cladding layer interposing the first guide layer and the second guide layer; and a striped third cladding layer having the second conductivity type and provided outside the second cladding layer, the striped third cladding layer being disposed on the opposite side to the first cladding layer with respect to the second cladding layer, wherein a difference $\Delta n$ between a refractive index $n_a$ of light confined in a first portion of the active layer which is covered by the striped third cladding layer and a refractive index $n_b$ of light confined in a second portion of the active layer which is not covered by the striped third cladding layer fulfills expression (1).

$$2\times10^{-3} \leq \Delta n \leq 7\times10^{-3} \qquad (1).$$

The second cladding layer having the second conductivity type may be a p-type cladding layer, the second guide layer may be disposed on the same side as the p-type cladding layer with respect to the active layer, and the forbidden band width of the second guide layer may be smaller than the forbidden band width of the quantum barrier layer.

The smaller one of the forbidden band width of the first guide layer and that of the second guide layer may be larger than a forbidden band width value corresponding to an energy of a laser oscillation light of the active layer.

Eg, Eb and E$\lambda$ may fulfill expression (2) where Eg is the smaller one of the forbidden band width of the first guide layer and that of the second guide layer, Eb is the forbidden band width of the quantum barrier layer, and E$\lambda$ is the forbidden band width value corresponding to the energy of the laser oscillation light energy of the active layer: E$\lambda$+100 meV$\leq$Eg$\leq$Eb$-$50 meV ... (2).

Another light-emitting device of the present invention includes a layered structure including at least an active layer, wherein at least one selected layer in the layered structure includes an impurity-scarce region and an impurity-doped region, and the impurity-scarce region is disposed closer to the active layer than the impurity-doped region.

In one embodiment, the layered structure includes a pair of cladding layers interposing the active layer, and the at least one selected layer is at least one of the pair of cladding layers.

In another embodiment, the layered structure includes a pair of optical guide layers interposing the active layer, and the at least one selected layer is at least one of the pair of optical guide layers.

In still another embodiment, the layered structure includes an optical guide layer disposed on either side of the active layer, and the at least one selected layer is the optical guide layer.

The device may further include an intermediate impurity concentration region between the impurity-scarce region and the impurity-doped region.

The active layer may include a quantum well layer.

In one embodiment, the at least one selected layer is an optical guide layer, and the impurity-doped region may contain a p-type impurity at a carrier concentration of $4\times10^{17}$ cm$^{-3}$ or more and $1.2\times10^{18}$ cm$^{-3}$ or less.

In another embodiment, the at least one selected layer is an optical guide layer, and the impurity-doped region contains an n-type impurity at a carrier concentration of $2\times10^{17}$ cm$^{-3}$ or more and $1\times10^{18}$ cm$^{-3}$ or less.

An impurity concentration of the impurity-scarce region may be $\frac{1}{5}$ or less of an impurity concentration of the impurity-doped region.

The impurity-scarce region may have a thickness of 3 nm or more and 10 nm or less.

The impurity-scarce region may be provided in at least one of a p-type cladding layer and a p-type optical guide layer.

In one embodiment, the layered structure includes a p-type cladding layer and an n-type cladding layer interposing the active layer, the impurity-scarce region is provided in each of the p-type cladding layer and the n-type cladding layer, and the impurity-scarce region in the p-type cladding layer is thicker than the impurity-scarce region in the n-type cladding layer.

In another embodiment, the layered structure includes a p-type optical guide layer and an n-type optical guide layer interposing the active layer, the impurity-scarce region is provided in each of the p-type optical guide layer and the n-type optical guide layer, and the impurity-scarce region in the p-type optical guide layer is thicker than the impurity-scarce region in the n-type optical guide layer.

The intermediate impurity concentration region may have a thickness of 3 nm or more and 10 nm or less.

In one embodiment, the active layer has a multiple quantum well structure including a plurality of quantum well layers and a barrier layer interposed by the adjacent quantum well layers, and a forbidden band width of at least the impurity-doped region of the at least one selected layer is smaller than a forbidden band width of the barrier layer and larger than a forbidden band width of the quantum well layers.

The forbidden band width of the impurity-doped region may be smaller than the forbidden band width of the impurity-scarce region.

The at least one selected layer may be formed of a material selected from the group consisting of AlGaAs type materials, AlGaInP type materials and InGaN type materials.

Another aspect of the present invention provides a method for fabricating a light-emitting device which includes a layered structure including at least an active layer, wherein at least one selected layer in the layered structure includes an impurity-scarce region, an impurity-doped region, and an intermediate impurity concentration region disposed between the impurity-scarce region and the impurity-doped region, the impurity-scarce region being disposed closer to the active layer than the impurity-doped region. The method includes the steps of: growing an impurity-doped layer and a non-impurity-doped layer; and diffusing an impurity from the impurity-doped layer to the non-impurity-doped layer by thermal hysteresis during crystal growth, thereby forming the intermediate impurity concentration region.

In one embodiment, the layered structure is formed so as to include a p-type cladding layer and an n-type cladding layer interposing the active layer, the impurity-scarce region is provided in each of the p-type cladding layer and the n-type cladding layer, and the impurity-scarce region in the p-type cladding layer is formed to be thicker than the impurity-scarce region in the n-type cladding layer.

In another embodiment, the layered structure is formed to include a p-type optical guide layer and an n-type optical guide layer interposing the active layer, the impurity-scarce region is provided in each of the p-type optical guide layer and the n-type optical guide layer, and the impurity-scarce region in the p-type optical guide layer is formed to be thicker than the impurity-scarce region in the n-type optical guide layer.

In the above-described structure, setting the forbidden band width of the guide layers to be smaller than the forbidden band width of the quantum barrier layer corresponds to setting the refractive index of the guide layers to be larger than the refractive index of the quantum barrier layer. Accordingly, the above setting provides an enhanced light confinement ratio in the quantum well layers in the multiple quantum well (or MQW) active layer, thereby reducing the threshold current. Furthermore, it is not necessary to increase the thickness of the guide layers as is necessary in the conventional examples for the purpose of reducing the threshold current, and thus the operating voltage is prevented from being increased which would otherwise be caused by the increased device resistance in the conventional art.

In the case where the semiconductor device is formed of, for example, Al-type semiconductor materials, setting the forbidden band width of the guide layers to be smaller than the forbidden band width of the quantum barrier layer corresponds to setting the Al mole fraction of the guide layers to be lower than the Al mole fraction of the quantum barrier layer. Accordingly, dopant diffusion from the cladding layers to the guide layers is suppressed by the above setting. Since the dopant diffusion to the MQW active layer is also suppressed, the Al mole fraction of the quantum well layers in the MQW active layer is restricted from changing, thereby preventing the oscillation wavelength from shifting.

Controlling the forbidden band width of the guide layers corresponds to controlling the refractive index thereof. Accordingly, the vertical radiation angle is allowed to be adjusted by appropriately setting the refractive indices of the two guide layers.

When the Al mole fraction of the guide layers is set to be lower than the Al mole fraction of the quantum barrier layer, the number of the non-emission recombination levels in the guide layers is reduced. Accordingly, non-emission recombination is restricted with respect to carriers leaking to the guide layers from the quantum well layers. Thus, the carriers are used effectively for light emission so as to reduce the threshold current.

In the case where a saturable absorption layer with a forbidden band width having a light emitting energy level which is substantially equal to an energy level of the laser oscillation light of the MQW active layer is provided between two cladding layer, for example, between the first and second cladding layers or between the first and third cladding layers, self-sustaining pulsation occurs; i.e., laser light oscillates in the form of pulses. In the self-sustaining pulsation condition, the longitudinal lasing mode becomes a multiple mode, and thus the spectral line width of each of the longitudinal modes is enlarged. Therefore, coherency of the laser is reduced and is not influenced by the returning light, resulting in reduced noise.

In the structure having the saturable absorption layer, dopant diffusion from the cladding layer provided between the MQW active layer and the saturable absorption layer is suppressed by the saturable absorption layer. In consequence, it is considered that dopant diffusion to the MQW active layer may undesirably increase. However, since the Al mole fraction of the guide layers is set to be smaller than the Al mole fraction of the quantum barrier layer, the dopant diffusion from the cladding layers to the guide layers is suppressed. Accordingly, the dopant diffusion to the MQW active layer is suppressed. Thus, the Al mole fraction of the quantum well layers of the MQW active layer is prevented from changing and, consequently, the oscillation wavelength is prevented from shifting.

In the case where the striped third cladding layer is provided and the refractive index difference $\Delta n$ is set within the range of expression (1), the amount of saturable absorption increases in a portion of the active layer which is not covered by the striped third cladding layer. Thus, self-sustaining pulsation occurs while the light is confined in a portion of the active layer which is covered by the striped third cladding layer. In consequence, there exists less influence due to wave fronts caused by the saturable absorption effect in the portion of the active layer which is not covered by the striped third cladding layer. Therefore, a beam spot of the emitted light is less shifted in a horizontal direction, thereby reducing the astigmatic difference and improving the optical characteristics of the semiconductor laser.

The degree of dopant diffusion depends on constituting materials of the cladding layers. For example, in the case of AlGaInP-type cladding layers, the dopant in a p-type cladding layer is more likely to diffuse as compared to the case of AlGaAs-type cladding layers. According to the present invention, even in such a case, the wavelength is prevented from shifting more effectively by setting the forbidden band width of the second guide layer, provided on the side of the p-type cladding layer, to be smaller than that of the quantum barrier layers so as to restrict the dopant diffusion to the active layer.

In the case where the forbidden band width of either one of the two guide layers which is smaller is set to be larger than a forbidden band width level corresponding to the laser oscillation light energy of the active layer, the threshold current is reduced more effectively.

Especially in the case where the smaller forbidden band width Eg of the two guide layers is set to fulfill expression (2), the threshold current is reduced more effectively.

Moreover, according to the present invention, at least one of the cladding layers interposing the active layer may include an impurity-scarce region and an impurity-doped region. The impurity-scarce region, having a lower impurity concentration than that of the impurity-doped region, is disposed closer to the active layer. Accordingly, impurity diffusion from the impurity-doped region to the active layer during the operation is blocked at the impurity-scarce region.

Alternatively, in the case where at least one of the optical guide layers interposing the active layer includes an impurity-doped region, the resistance of the entire optical guide layers is lowered. Furthermore, the diffusion potential between the optical guide layer and the cladding layer is lowered, and thus, the operating voltage is reduced. In addition, since the impurity-scarce region, having a lower impurity concentration than that of the impurity-doped region, is disposed closer to the active layer, impurity diffusion from the impurity-doped region to the active layer during the operation is blocked at the impurity-scarce region. Thus, the reliability of the device is improved.

In the case where the optical guide layer provided on one side of the active layer includes an impurity-doped region, the resistance of the entire optical guide layers is lowered. Furthermore, the diffusion potential between the optical guide layer and the cladding layers is lowered, the operating voltage is reduced. In addition, since the impurity-scarce region, having a lower impurity concentration than that of the impurity-doped region, is disposed closer to the active layer, impurity diffusion from the impurity-doped region to the active layer during the operation is blocked at the impurity-scarce region. Thus, the reliability of the device is improved.

In the case where the intermediate impurity concentration region having an impurity concentration which is lower than that of the impurity-doped region but higher than that of the impurity-scarce region is provided between the impurity-scarce region and the impurity-doped region, impurity diffusion from the impurity-doped region to the impurity-scarce region during the operation is blocked. Thus, the reliability of the device is further improved.

Especially, when the active layer includes a quantum well layer, even a slight impurity diffusion is generally likely to cause changes in the layered structure resulting in the deteriorated device characteristics. However, the present invention is very effective for restricting impurity diffusion to the active layer during the operation even in such a case.

In the case where the impurity in the impurity-doped region of the optical guide layer is of the p-type, the carrier concentration of the impurities is preferably set to $4 \times 10^{17}$ cm$^{-3}$ or more and $1.2 \times 10^{18}$ cm$^{-3}$ or less. In the case where the impurity in the impurity-doped region of the optical guide layer is of the n-type, the carrier concentration of the impurities is preferably set to $2 \times 10^{17}$ cm$^{-3}$ or more and $1 \times 10^{18}$ cm$^{-3}$ or less. Due to such setting, the operation voltage is effectively reduced, and deterioration of the device characteristics otherwise caused by non-emission recombination of the carriers in the impurity-doped region is effectively suppressed. Regarding the impurity concentration in the impurity-doped region of the cladding layers, any concentration at which the carrier confinement into the active layer is realized is appropriate.

The carrier concentration of the impurities in the impurity-scarce region is preferably set to $\frac{1}{5}$ or less of that in the impurity-doped region in order to effectively suppress impurity diffusion to the active layer during the operation.

The thickness of the impurity-scarce region is preferably set to be 3 nm or more and 10 nm or less. When the thickness is less than 3 nm, the impurity diffusion into the active layer during the operation occurs, which is likely deteriorate the device characteristics. When the thickness is more than 10 nm, carrier injection from the impurity-doped region to the active layer is inhibited by the potential barrier, which is likely to raise the operating voltage. Regarding the thickness of the impurity-doped region of the cladding layers, any thickness at which the carrier confinement into the active layer is realized is appropriate. Regarding the thickness of the impurity-doped region of the optical guide layer, any thickness at which the light confinement into the active layer is realized is appropriate.

The impurity-scarce region can be provided in only a p-type cladding layer or a p-type optical guide layer, since a p-type impurity, which has a larger diffusion coefficient than an n-type impurity, is more likely to diffuse to the active layer and thus is more likely to deteriorate the device characteristics. In such a structure, the device designing is relatively easily performed since only the thickness control of the p-type impurity-scarce region is required.

The impurity-scarce region provided in the p-type cladding layer or the p-type optical guide layer can be thicker than the impurity-scarce region provided in the n-type cladding layer or the n-type optical guide layer. In such a structure, the thickness of the impurity-scarce region can be controlled in accordance with the degree of diffusion of the p-type impurity having a larger diffusion coefficient than that of the n-type impurity. Accordingly, the device can be designed with higher controllability.

The thickness of the intermediate impurity concentration region is preferably set to be 3 nm or more and 10 nm or less. A thickness within this range effectively prevents impurity diffusion from the impurity-doped region to the impurity-scarce region during the operation without inhibiting carrier injection from the impurity-doped region to the active layer.

When the active layer includes a multiple quantum well layer, the forbidden band width of at least the impurity-doped region of the optical guide layer can be smaller than the forbidden band width of the quantum barrier layer but larger than the forbidden band width of the quantum well layers. In general, in a compound semiconductor material containing Al, the Al mole fraction is in proportion to the forbidden band width, and the Al mole fraction can be lowered by reducing the forbidden band width of the impurity-doped region. Thus, the impurity diffusion from the impurity-doped region to the active layer is further reduced. This allows a thinner impurity-scarce region, which is effective in reducing the operating voltage.

The forbidden band width of the entire optical guide layer including the impurity-scarce region and the intermediate impurity concentration region can be smaller than the forbidden band width of the barrier layer but larger than the forbidden band width of the quantum well layers. When the forbidden band width of the impurity-doped region is smaller than the forbidden band width of the impurity-scarce region, the carrier confinement into the active layer is established by the impurity-scarce region. Accordingly, the Al mole fraction of the impurity-doped region can be further lowered so as to further reduce impurity diffusion from the impurity-doped region to the active layer. This allows a thinner impurity-scarce region, which is effective in reducing the operating voltage.

The cladding layers and/or the optical guide layers can be formed of, for example, AlGaAs-type materials, AlGaInP-type materials, or InGaN-type materials. The present invention is especially effective for the AlGaInP-type materials, since impurities are more likely to diffuse in this type of materials, as compared to the AlGaAs-type materials. The present invention is also effective for the InGaN-type materials, which have a higher growth temperature and are more likely to cause impurity diffusion, as compared to the AlGaInP-type materials.

According to the present invention, the intermediate impurity concentration region can be formed by diffusing impurities from the impurity-doped layer to the non-impurity-doped layer by thermal hysteresis during the crystal growth. Thus, the impurity-doped region, the intermediate impurity concentration region, and the impurity-scarce region can be formed through a simple fabrication process with satisfactory controllability. This thermal hysteresis temperature (i.e., the crystal growth temperature) is typically set, for example, at 600° C. to 800° C. in the case of the AlGaAs-type materials, 500° C. to 700° C. in the case of the AlGaInP-type materials, and 900° C. to 1100° C. in the case of the InGaN-type materials. The intermediate impurity concentration region can be formed at a temperature lower than the growth temperature of the active layer by about 50° C. to 200° C. in order to control the impurity diffusion.

The non-impurity-doped region provided in the p-type cladding layer or the p-type optical guide layer can be thicker than the non-impurity-doped region provided in the n-type cladding layer or the n-type optical guide layer. In such a structure, the thickness of the impurity-scarce region can be controlled by controlling the thickness of the non-impurity-doped regions in accordance with the degree of diffusion of the p-type impurity having a larger diffusion coefficient than that of the n-type impurity. Accordingly, the device can be designed with higher controllability.

Thus, the invention described herein makes possible the advantages of providing: (1) a light-emitting device capable of reducing the operating voltage while maintaining satisfactory characteristics, and a method for fabricating the same; (2) a light-emitting device capable of reducing the threshold current without increasing the operating voltage, and a method for fabricating the same; and (3) a light-emitting device capable of preventing the oscillating wavelength from being shifted, and a method for fabricating the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings. In this specification, the terms "guide layer" and "optical guide layer" are used interchangeably.

EXAMPLE 1

Figure 1:
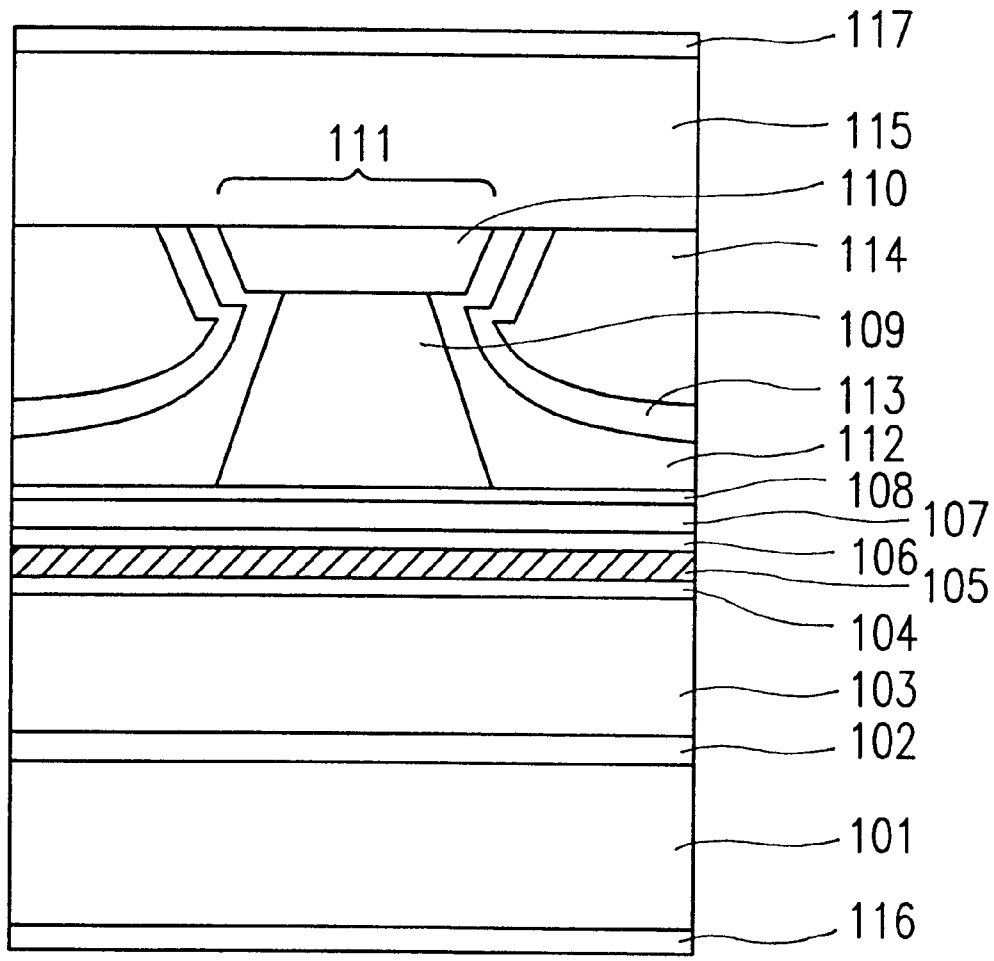
FIG. 1 is a cross-sectional view of a semiconductor laser in a first example according to the present invention.
Figure 2:
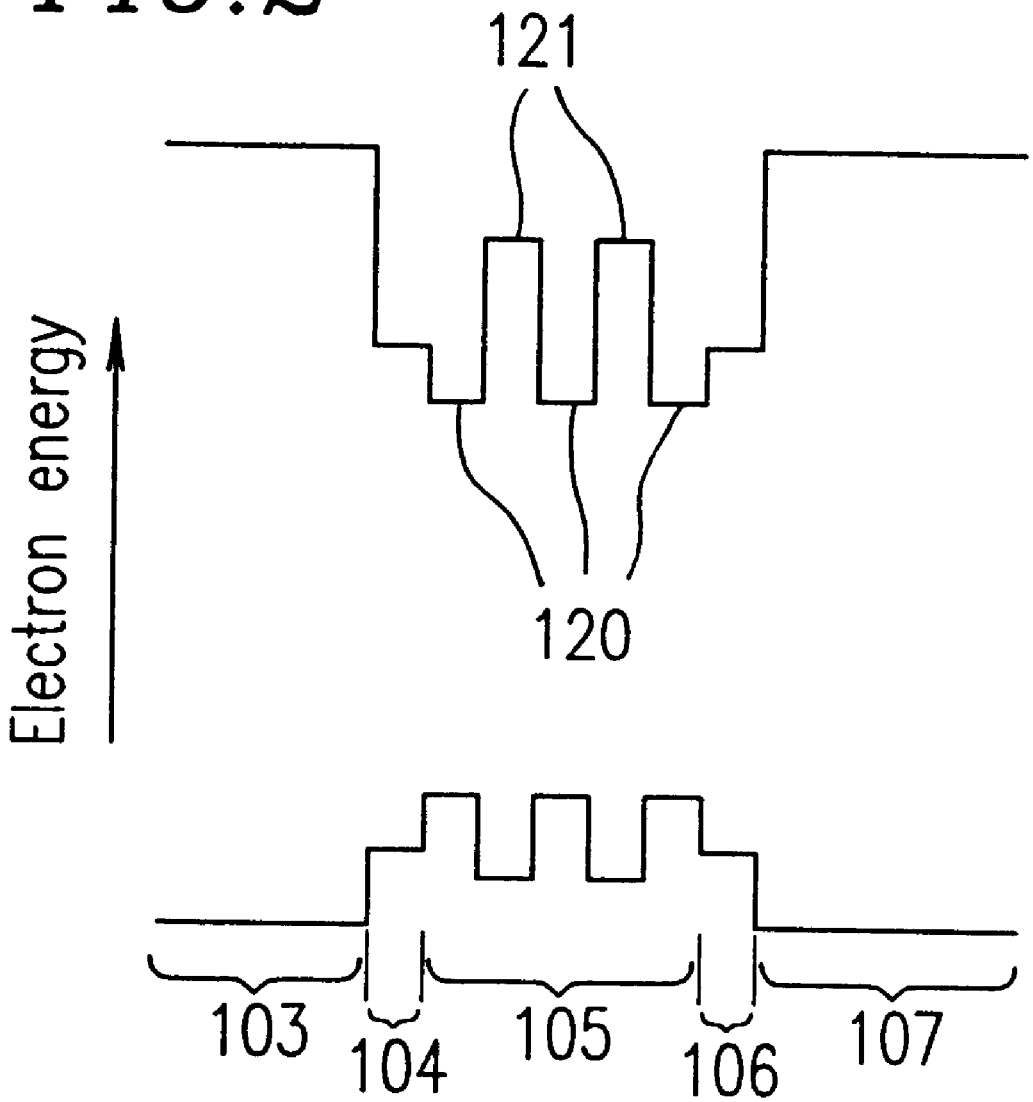
FIG. 2 is an energy band diagram of an active layer and the vicinity thereof of the semiconductor laser shown in FIG. 1.

FIG. 1 is a cross-sectional view of a semiconductor laser 100 in a first example according to the present invention, and FIG. 2 is an energy band diagram of an active layer and the vicinity thereof of the semiconductor laser 100.

As shown in FIG. 1, the semiconductor laser 100 includes an n-type GaAs substrate 101, an n-type GaAs buffer layer 102 having a thickness of, for example, about 0.5 μm, an n-type $Al_{0.5}Ga_{0.5}As$ first cladding layer 103 having a thickness of, for example, about 1.5 μm, an $Al_{0.25}Ga_{0.75}As$ first guide layer 104 having a thickness of, for example, about 15 nm, a non-doped MQW active layer 105, an $Al_{0.25}Ga_{0.75}As$ second guide layer 106 having a thickness of, for example, about 15 nm, a p-type $Al_{0.5}Ga_{0.5}As$ second cladding layer 107 having a thickness of, for example, about 0.2 μm, a p-type GaAs etching stop layer 108 having a thickness of, for example, about 0.003 μm, a p-type $Al_{0.5}Ga_{0.5}As$ third cladding layer 109 having a thickness of, for example, about 1.2 μm, and a p-type GaAs cap layer 110 having a thickness of, for example, about 0.8 μm. On the n-type GaAs substrate 101, these layers are sequentially provided by metal organic chemical vapor deposition (hereinafter, referred to as "MOCVD").

As shown in FIG. 2, the MQW active layer 105 includes three $Al_{0.1}Ga_{0.9}As$ quantum well layers 120 each having a thickness of, for example, about 8 nm and two $Al_{0.35}Ga_{0.65}As$ quantum barrier layers 121 each having a thickness of, for example, about 5 nm, which are provided alternately. The forbidden band width of each semiconductor layer is determined by the Al mole fraction.

Returning to FIG. 1, the p-type GaAs etching stop layer 108 is as thin as 0.003 μm, and thus does not influence the light confinement or inner light absorption. The etching stop layer 108 is also advantageous in forming a ridge stripe (described later) by controlled etching. It is possible, though, to control the etching process based on time for forming the ridge stripe even when the etching stop layer 108 is not provided.

After the above-described layered structure is provided, a stripe mask formed of a photoresist is provided on a surface of the layered structure, and selective etching is performed until being stopped at a surface of the p-type GaAs etching stop layer 108. Thus, the ridge stripe 111 having a bottom width of, for example, about 2.2 μm is formed.

Next, an n-type $Al_{0.7}Ga_{0.3}As$ first current and light confinement layer 112 having a thickness of, for example, about 0.6 μm, an n-type GaAs second current confinement layer 113 having a thickness of, for example, about 0.3 μm, and a p-type GaAs planarizing layer 114 having a thickness of, for example, about 0.3 μm are sequentially grown on the etching stop layer 108 by MOCVD so as to bury both sides of the ridge stripe 111.

Then, a p-type GaAs contact layer 115 is grown to a thickness of, for example, about 3 μm by MOCVD so as to cover a surface of the p-type GaAs cap layer 110 and a surface of the p-type GaAs planarizing layer 114. An n-side electrode 116 is provided on a surface of the n-type GaAs substrate 101, and a p-side electrode 117 is provided on a surface of the p-type GaAs contact layer 115. The cavity length is adjusted to 375 μm by cleaving. An $Al_2O_3$ layer and an Si layer are provided on each of end faces of the cavity, so that a light reflectance on a light emitting face of the cavity is 10% and a light reflectance on a rear face of the resonator is 75%.

When a forward voltage was applied between the n-side electrode 116 and the p-side electrode 117 of the semiconductor laser 100, an operating current of 50 mA and an operating voltage of 1.8 V were obtained under the conditions of an oscillating wavelength of 0.78 μm, a threshold current of 15 mA, a slope efficiency of current vs. optical output characteristic of 1.0 W/A, and an optical output of 35 mW.

Figure 24:
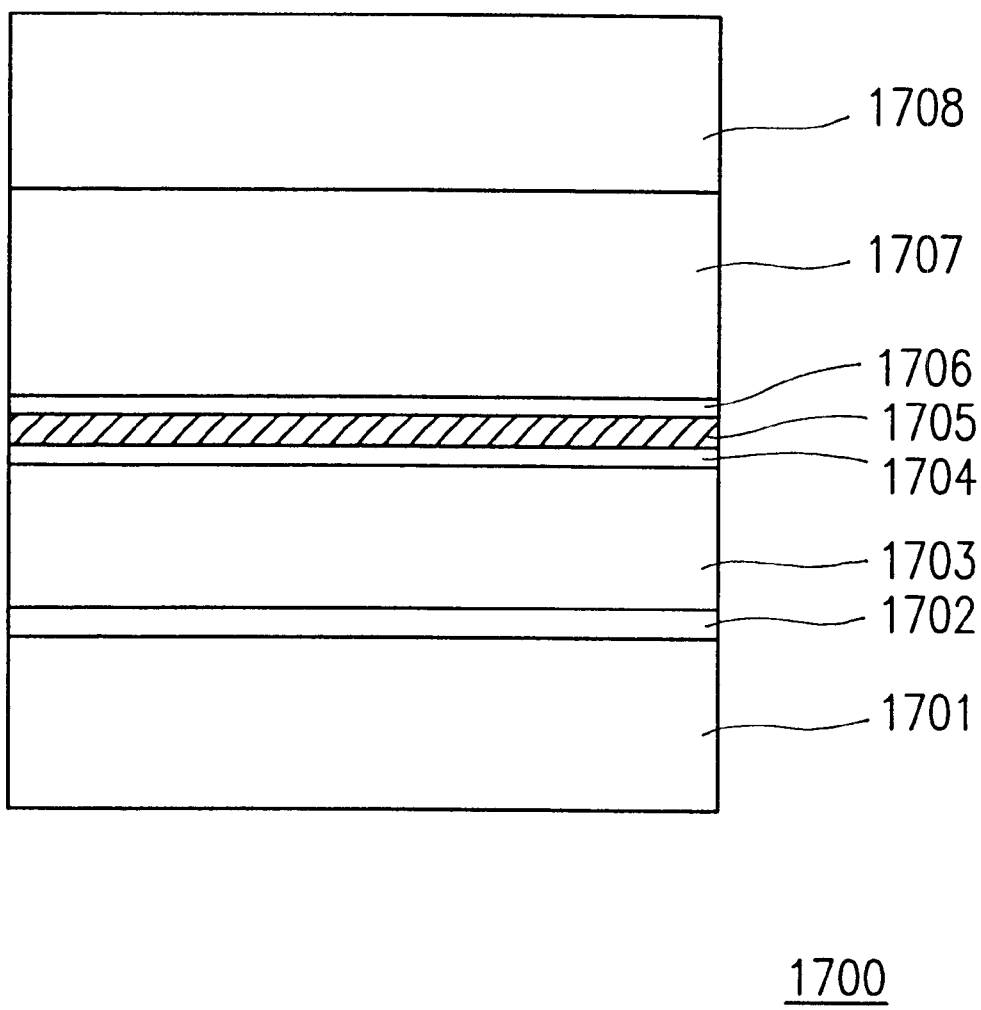
FIG. 24 is a cross-sectional view of another conventional semiconductor laser light.
Figure 25:
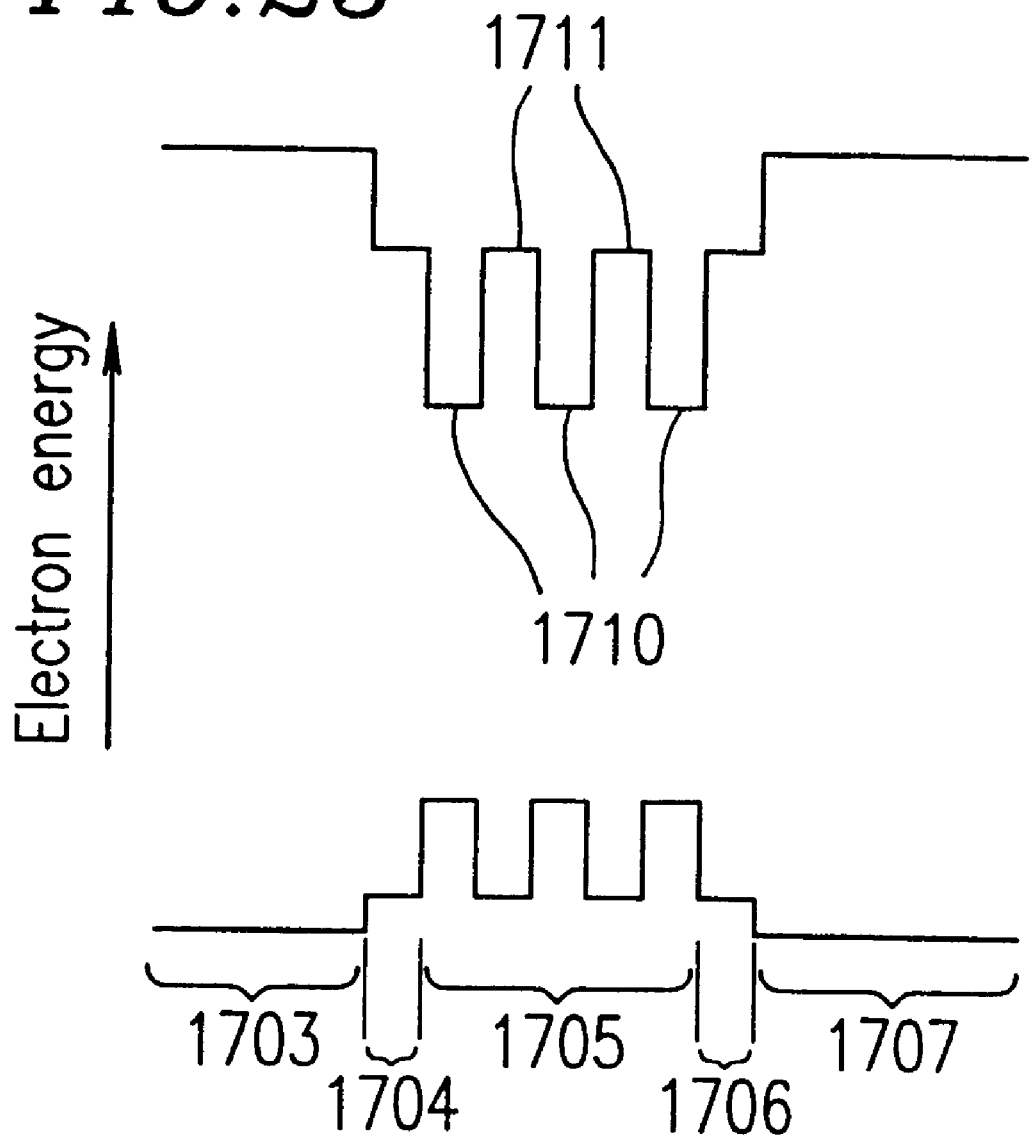
FIG. 25 is an energy band diagram of an active layer and the vicinity thereof of the conventional semiconductor laser shown in FIG. 24.

In the case where the conventional semiconductor laser 1700 (FIG. 24) was fabricated to have the first guide layer 1704 and the second guide layer 1706 each having a forbidden band width equal to that of the quantum barrier layer 1711 (i.e., Al mole fraction of 0.35 in the first and second guide layer 1704 and 1706), a threshold current of 25 mA, an operating current of 60 mA and an operating voltage of 1.8 V were obtained. The above conventional case will be referred to as "conventional 1".

As can be appreciated from the above-described results, the semiconductor laser 100 in the first example according to the present invention reduces the threshold current to 15 mA from 25 mA without increasing the operating voltage. The results are summarized in Table 1.

TABLE 1

|  | Example 1 | Conventional 1 |
| --- | --- | --- |
| Threshold current | 15 mA | 25 mA |
| Operating voltage | 1.8 v | 1.8 V |

In the case where the thickness of each of the first guide layer 1704 and the second guide layer 1706 is set to as thick as 50 nm in the semiconductor 1700 (such a conventional case will be referred to as "conventional 2"), the threshold current can be reduced to 15 mA, which is equal to the threshold current obtainable in the first example. However, since the resistance of the semiconductor laser in the "conventional 2" increases due to the increased thicknesses of the guide layers 1704 and 1706, the operating voltage is increased to 2.1 V. The results are summarized in Table 2.

TABLE 2

|  | Example 1 | Conventional 2 |
| --- | --- | --- |
| Threshold current | 15 mA | 15 mA |
| Operating voltage | 1.8 v | 2.1 V |

The semiconductor laser 100 has an oscillating wavelength of 0.78 μm when the oscillating wavelength is designed to be at 0.78 μm. Thus, the oscillating wavelength is controlled satisfactorily. In the case of the semiconductor laser indicated as conventional 1, the actual oscillating wavelength may be shifted to 0.775 μm with respect to the designed value of 0.78 μm. Thus, it is difficult to control the oscillating wavelength satisfactorily.

As shown in FIG. 2, the first and second guide layers 104 and 106 are adjacent to the quantum well layers 120, and the forbidden band width of each of the first and second guide layers 104 and 106 is larger than that of the quantum well layers 120 but smaller than that of the quantum barrier layers 121.

Setting the forbidden band width of the first and second guide layers 104 and 106 to be smaller than that of the quantum barrier layers 121 corresponds to setting the Al mole fraction of the first and second guide layers 104 and 106 to be lower than that of the quantum barrier layers 121. Accordingly, the dopant is suppressed from diffusing from the cladding layers 103 and 107 to the first and second guide layers 104 and 106. Therefore, the dopant diffusion into the MQW active layer 105 is suppressed, thereby suppressing the Al mole fraction in the quantum well layers 120 of the MQW active layer 105 from changing. In consequence, the oscillating wavelength is restricted from being shifted.

Controlling the forbidden band width of the first and second guide layers 104 and 106 corresponds to controlling the refractive index of the layers 104 and 106. Accordingly, the vertical radiation angle is allowed to be adjusted by appropriately setting the refractive index of each of the first and second guide layers 104 and 106.

The number of non-emission recombination levels in the first and second guide layers 104 and 106 is allowed to be lowered by setting the Al mole fraction of the first and second guide layers 104 and 106 to be lower than that of the quantum barrier layers 121. Accordingly, the non-emission recombination is restricted with respect to carriers leaking to the first and second guide layers 104 and 106 from the quantum well layers 120. Thus, the carriers are used effectively for the light emission, resulting in a reduced threshold current.

Figure 3:
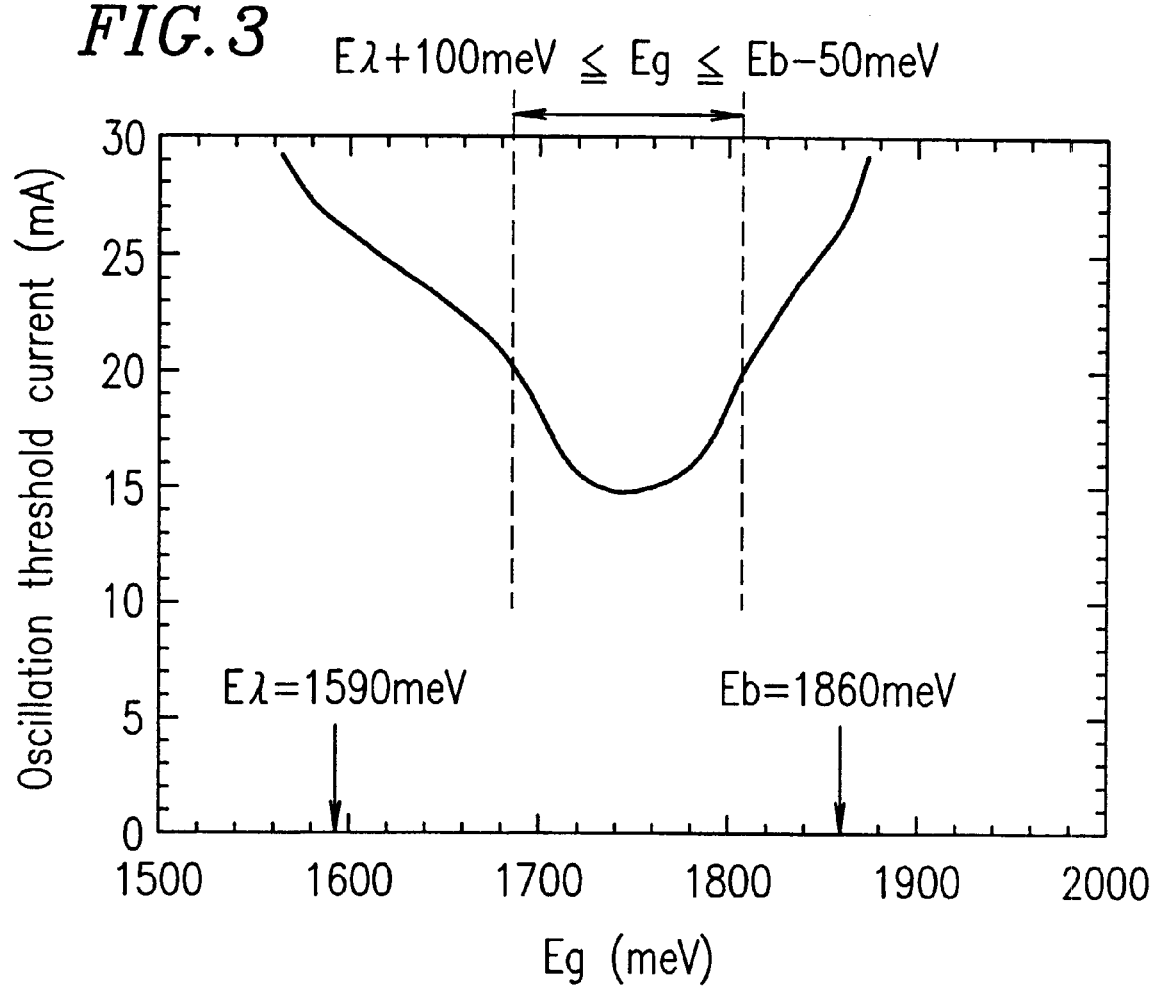
FIG. 3 is a graph illustrating the relationship between the forbidden band width of the guide layers and the threshold current of the semiconductor laser shown in FIG. 1.

A change in the threshold current was measured by changing the Al mole fraction of the first and second guide layers 104 and 106, namely, the forbidden band width thereof, in the semiconductor laser 100. FIG. 3 shows the results, namely, the relationship between the forbidden band width of the first and second guide layers 104 and 106 and the threshold current. In FIG. 3, Eg represents the forbidden band width of the first and second guide layers 104 and 106. Eb represents the forbidden band width of the quantum barrier layer 121, and Eλ represents the forbidden band width of the MQW active layer 105 which corresponds to the energy of the laser oscillation light. It is understood from the results that the threshold current reduces as Eg becomes smaller than Eb and that the larger threshold current is obtained when Eg is smaller than Eλ, as compared to the case of Eg=Eb. In particular, the threshold current reaches its minimum when Eg fulfills expression (2).

$$E\lambda+100 \text{ meV} \leq Eg \leq Eb-50 \text{ meV} \qquad (2)$$

As can be appreciated from the results, the threshold current significantly depends on the forbidden band width of the first and second guide layers 104 and 106. When Eg is smaller than Eλ+100 meV, the threshold current increases for the following reason. The carriers injected into the quantum well layers 120 of the MQW active layer 105 leak from the quantum well layers 120 to the first and second guide layers 104 and 106 which are adjacent to the quantum well layers 120. Thus, the carrier confinement ratio into the quantum well layers 120 is lowered. Accordingly, the amount of the carriers required for oscillation increases, which raises the threshold current.

When Eg is larger than Eb-50 meV, the threshold current increases for the following reason. The refractive index of the first and second guide layers 104 and 106 is lowered in the above situation. Thus, the carrier confinement ratio into the MQW active layer 105 is lowered. Accordingly, a larger current is required for the oscillation.

EXAMPLE 2

Figure 4:
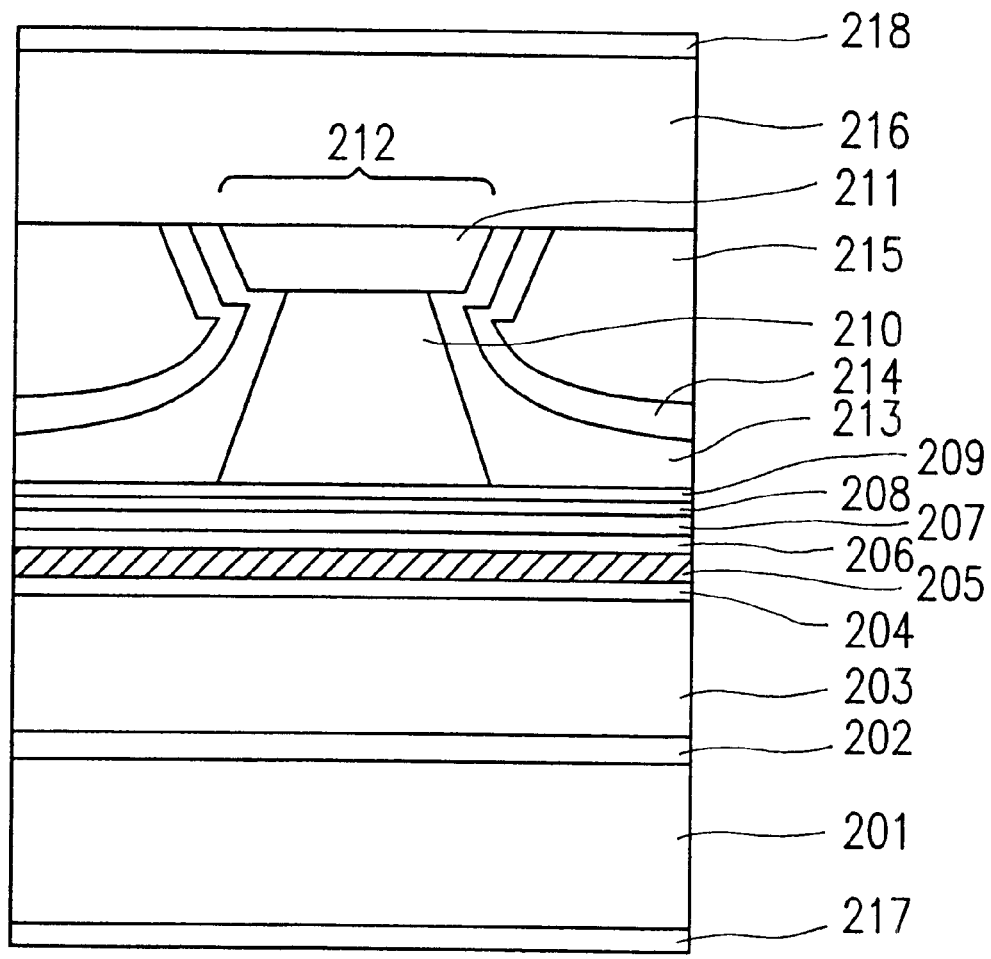
FIG. 4 is a cross-sectional view of a semiconductor laser in a second example according to the present invention.
Figure 5:
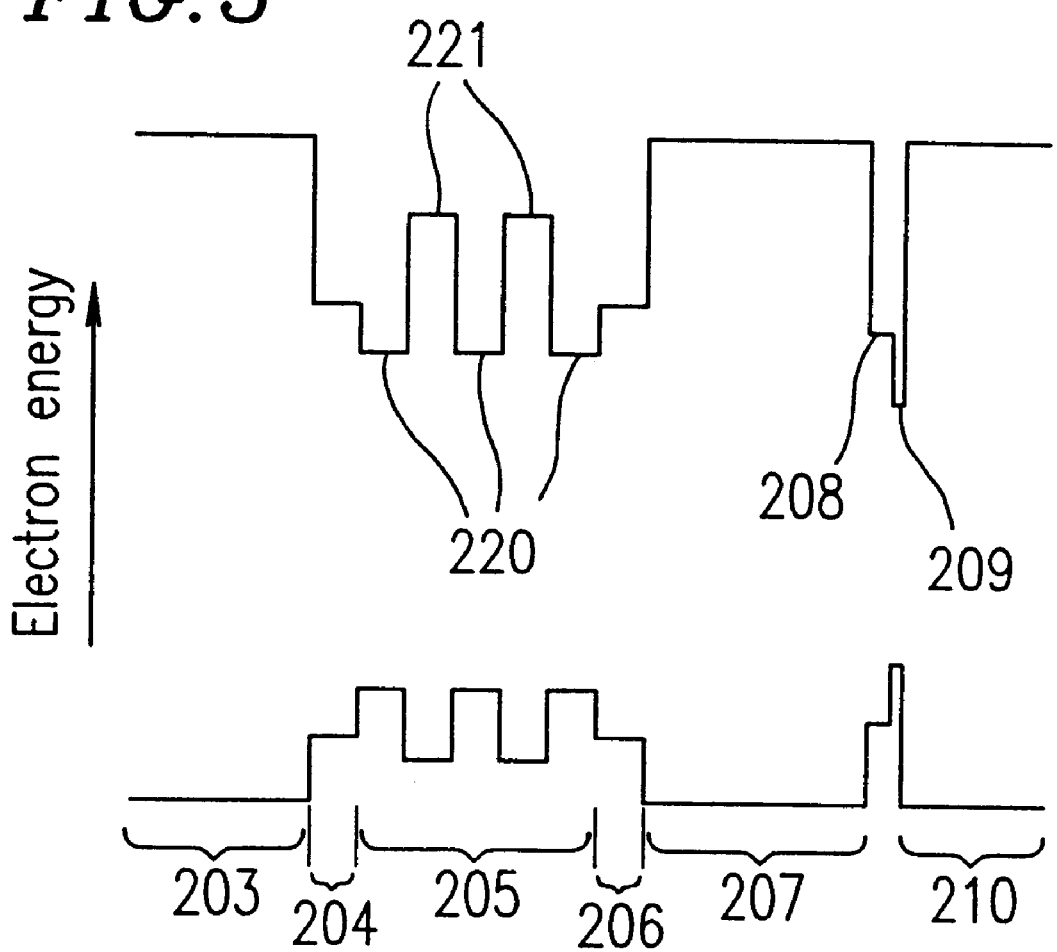
FIG. 5 is an energy band diagram of an active layer and the vicinity thereof of the semiconductor laser shown in FIG. 4.

FIG. 4 is a cross-sectional view of a semiconductor laser 200 in a second example according to the present invention, and FIG. 5 is an energy band diagram of an active layer and the vicinity thereof of the semiconductor laser 200.

As shown in FIG. 4, the semiconductor laser 200 includes an n-type GaAs substrate 201, an n-type GaAs buffer layer 202 having a thickness of, for example, about 0.5 μm, an n-type $Al_{0.5}Ga_{0.5}As$ first cladding layer 203 having a thickness of, for example, about 1.5 μm, an $Al_{0.27}Ga_{0.73}As$ first guide layer 204 having a thickness of, for example, about 10 nm, a non-doped MQW active layer 205, an $Al_{0.27}Ga_{0.73}As$ second guide layer 206 having a thickness of, for example, about 10 nm, a p-type $Al_{0.5}Ga_{0.5}As$ second cladding layer 207 having a thickness of, for example, about 0.2 μm, a p-type $Al_{0.2}Ga_{0.8}As$ etching block layer 208 having a thickness of, for example, about 0.2 μm, a p-type GaAs etching stop layer 209 having a thickness of, for example, about 0.003 μm, a p-type $Al_{0.5}Ga_{0.5}As$ third cladding layer 210 having a thickness of, for example, about 1.2 μm, and a p-type GaAs cap layer 211 having a thickness of, for example, about 0.8 μm. on the n-type GaAs substrate 201, these layers are sequentially provided by MOCVD.

As shown in FIG. 5, the MQW active layer 205 includes three $Al_{0.1}Ga_{0.9}As$ quantum well layers 220 each having a thickness of, for example, about 10 nm and two $Al_{0.35}Ga_{0.65}As$ quantum barrier layers 221 each having a thickness of, for example, about 5 nm, which are provided alternately.

Returning to FIG. 4, after a layered structure including the above-described layers is provided, a stripe mask formed of a photoresist is provided on a surface of the layered structure, and selective etching is performed until being stopped at a surface of the p-type GaAs etching stop layer 209. Thus, a ridge stripe 212 having a bottom width of, for example, about 2.2 μm is formed.

Next, an n-type $Al_{0.7}Ga_{0.3}As$ first current and light confinement layer 213 having a thickness of, for example, about 0.6 μm, an n-type GaAs second current confinement layer 214 having a thickness of, for example, about 0.3 μm, and a p-type GaAs planarizing layer 215 having a thickness of, for example, about 0.3 μm are sequentially grown on the etching stop layer 209 by MOCVD so as to bury both sides of the ridge stripe 212.

Then, a p-type GaAs contact layer 216 is grown to a thickness of, for example, about 3 μm by MOCVD so as to cover a surface of the p-type GaAs cap layer 211 and a surface of the p-type GaAs planarizing layer 215. An n-side electrode 217 is provided on a surface of the n-type GaAs substrate 201, and a p-side electrode 218 is provided on a surface of the p-type GaAs contact layer 216. The cavity length is adjusted to 375 μm by cleaving. An $Al_2O_3$ layer and an Si layer are provided on each of end faces of the cavity, so that a light reflectance on a light emitting face of the cavity is 12% and a light reflectance on a rear face of the cavity is 95%.

When a forward voltage was applied between the n-side electrode 217 and the p-side electrode 218 of the semiconductor laser 200, an operating current of 70 mA and an operating voltage of 1.8 V were obtained under the conditions of an oscillating wavelength of 0.78 μm, a threshold current of 30 mA, a slope efficiency of current vs. optical output characteristic of 0.75 W/A, and an optical output of 30 mW.

As shown in FIG. 5, the first and second guide layers 204 and 206 are adjacent to the quantum well layers 220, and the forbidden band width of each of the first and second guide layers 204 and 206 is larger than that of the quantum well layers 220 but smaller than that of the quantum barrier layers 221.

Moreover, the 0.003 μm-thick p-type GaAs etching stop layer 209 having a substantially equal light emitting energy to the energy of the laser oscillation light from the MQW active layer 205 is provided between the first and third cladding layers 203 and 210 and adjacent to the 0.2 μm-thick p-type $Al_{0.2}Ga_{0.8}As$ etching block layer 208. The etching stop layer 209 functions as a saturable absorption layer. Due to the saturable absorption effect of the etching stop layer 209, self-sustaining pulsation occurs; i.e., laser oscillation light oscillates in the form of pulses. In the self-exciting oscillation state, the longitudinal mode of the laser becomes multiple modes, and thus the spectral line width of each of the longitudinal modes is enlarged. Therefore, coherency of the laser is reduced and is not influenced by the returning light, resulting in reduced noise.

The semiconductor laser 200 has an oscillating wavelength of 0.78 μm when the oscillating wavelength is designed to be at 0.78 μm. Thus, the oscillating wavelength is controlled satisfactorily.

In the case where the conventional semiconductor laser 1700 (FIG. 24; indicated as "conventional 1" in Table 1) is fabricated to have the first guide layer 1704 and the second guide layer 1706 each having a forbidden band width equal to that of the quantum barrier layers 1711 (i.e., Al mole fraction of 0.35 in the first and the second guide layer 1704 and 1706), the oscillating wavelength can be shifted to 0.77 μm with respect to the designed value of 0.78 μm. Thus, it is difficult to control the oscillating wavelength satisfactorily.

The oscillating wavelength is satisfactorily controlled in the semiconductor laser 200 in the second example for the following reason.

The semiconductor laser 200 includes the p-type $Al_{0.2}Ga_{0.8}As$ etching block layer 208 and the p-type GaAs etching stop layer 209 having a low or zero Al mole fraction are provided adjacent to the p-type second cladding layer 207 for saturable absorption. Accordingly, the dopant in the p-type second cladding layer 207 is suppressed from diffusing at the layers 208 and 209 having a low or zero Al mole fraction. In contrast, the amount of the dopant which diffuses from the p-type second cladding layer 207 in the opposite direction toward the MQW active layer 205 increases.

In the case of the semiconductor laser 1700 (FIG. 24; indicated as "conventional 1" in Table 1), the Al mole fraction of the first and second guide layers 1704 and 1706 is substantially equal to that of the quantum barrier layers 1711. Accordingly, the dopant in the p-type second cladding layer 1707 is likely to diffuse to the quantum well layers 1710 of the MQW active layer 1705. Such diffusion changes the Al mole fraction in the quantum well layers 1710, thereby shifting the oscillating wavelength toward the shorter wavelength side.

As can be appreciated from the above description, the semiconductor laser 200 in the second example is advantageous in preventing the wavelength from being shifted. The change in the Al mole fraction in the quantum well layers of the MQW active layer caused by the dopant diffusion also influences the thicknesses of the quantum well layers and the quantum barrier layers. As a result, the above-described change in the Al mole fraction causes electrical and optical characteristics of the semiconductor laser to be different from the designed. values as well as the wavelength. The semiconductor laser 200 in the second example also solves such problems.

In the second example, the p-type GaAs etching stop layer 209 is provided as the saturable absorption layer adjacent to the p-type $Al_{0.2}Ga_{0.8}As$ etching block layer 208. Alternatively, it is possible to provide a single quantum well layer having a substantially equal quantum level to that of the quantum level of the MQW active layer 205, a multiple quantum well layer having a substantially equal quantum level to that of the quantum level of the MQW active layer 205, or a bulk-type semiconductor layer having a forbidden band width which is substantially equal to the quantum level of the MQW active layer 205 and having a thickness of greater than 20 nm. Each of these alternative layers is provided in the p-type second cladding layer. Either one of the above-described alternative structures provides the same effect.

In the second example, the saturable absorption layer is provided in the p-type cladding layer. Alternatively, the saturable absorption layer can be provided in the n-type cladding layer. In other words, the saturable absorption layer can be provided at an appropriate position between the p-type cladding layer and the n-type cladding layer which interpose the MQW active layer.

EXAMPLE 3

Figure 6:
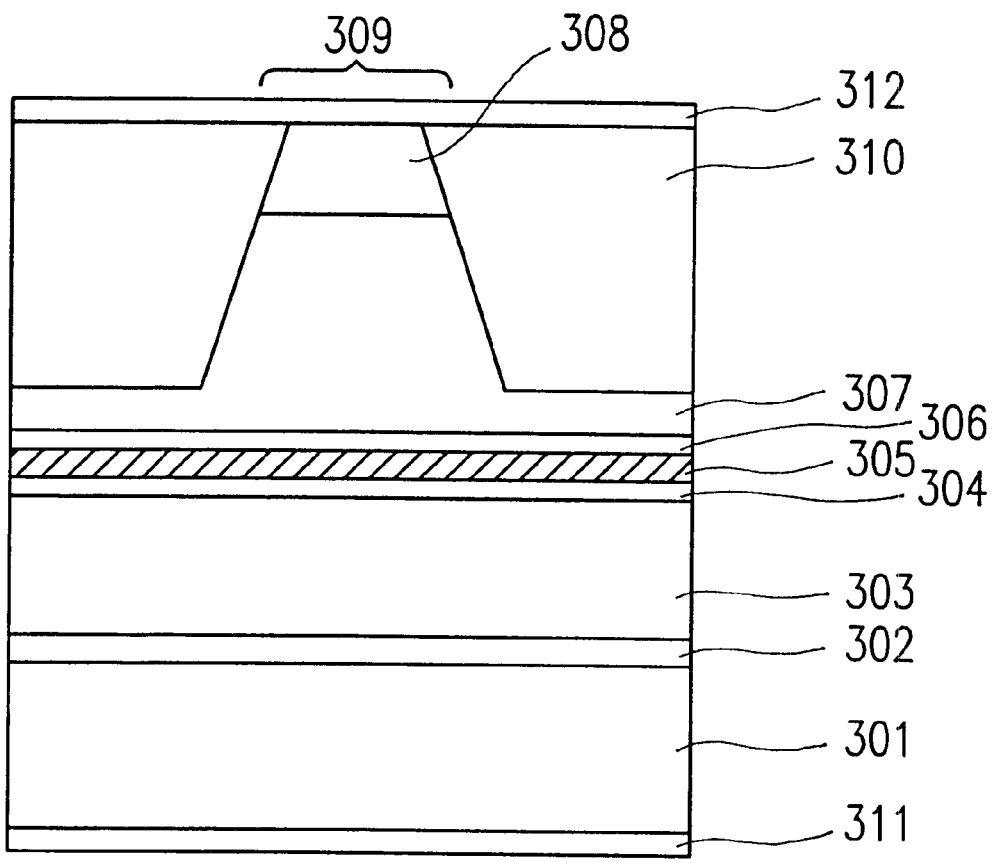
FIG. 6 is a cross-sectional view of a semiconductor laser in a third example according to the present invention.

FIG. 6 is a cross-sectional view of a semiconductor laser 300 in a third example according to the present invention.

As shown in FIG. 6, the semiconductor laser 300 includes an n-type GaAs substrate 301, an n-type $Ga_{0.5}In_{0.5}P$ buffer layer 302, an n-type $(Al_{0.7}Ga_{0.3})_{0.5}In_{0.5}P$ first cladding layer 303 having a thickness of, for example, about 1.5 μm, an $(Al_{0.4}Ga_{0.6})_{0.5}In_{0.5}P$ first guide layer 304 having a thickness of, for example, about 35 nm, a non-doped MQW active layer 305, an $(Al_{0.4}Ga_{0.6})_{0.5}In_{0.5}P$ second guide layer 306 having a thickness of, for example, about 35 nm, a p-type $(Al_{0.7}Ga_{0.3})_{0.5}In_{0.5}P$ second cladding layer 307 having a thickness of, for example, about 1.5 μm, and a p-type $Ga_{0.5}In_{0.5}P$ cap layer 308 having a thickness of, for example, about 0.3 μm. On the n-type GaAs substrate 301, these layers are sequentially provided by molecular beam epitaxy (hereinafter, referred to as "MBE").

Although not shown, the MQW active layer 305 includes four $Ga_{0.5}In_{0.5}P$ quantum well layers each having a thickness of, for example, about 8 nm and three $(Al_{0.5}Ga_{0.5})_{0.5}In_{0.5}P$ quantum barrier layers 321 each having a thickness of, for example, about 5 nm, which are provided alternately.

After a layered structure including the above-described layers is provided, a stripe mask formed of a photoresist is provided on a surface of the layered structure, and selective etching is performed to form a ridge stripe 309. The selective etching is performed until a flat portion of the p-type $(Al_{0.7}Ga_{0.3})_{0.5}In_{0.5}P$ second cladding layer 307 which is not included in the ridge stripe 309 becomes 0.3 μm thick. The resultant ridge stripe 309 has a bottom width of, for example, about 5 μm.

Next, an n-type GaAs current and light confinement layer 310 having a thickness of, for example, about 1.2 μm is grown on the 3 μm-thick portion of the second cladding layer 307 by MBE to bury the ridge stripe 309.

Then, an n-side electrode 311 is provided on a surface of the n-type GaAs substrate 301, and a p-side electrode 312 is provided on a surface of the p-type GaAs cap layer 308. The cavity length is adjusted to 500 μm by cleaving. An $Al_2O_3$ layer and an Si layer are provided on each of end faces of the cavity, so that a light reflectance on a light emitting face of the cavity is 50% and a light reflectance on a rear face of the cavity is 85%.

When a forward voltage was applied between the n-side electrode 311 and the p-side electrode 312 of the semiconductor laser 300, an operating current of 35 mA and an operating voltage of 2 V were obtained under the conditions of an oscillating wavelength of 0.65 μm, a threshold current of 30 mA, a slope efficiency of current vs. optical output characteristic of 0.6 W/A, and an optical output of 3 mW. As can be appreciated from these results, the operation voltage is suppressed from increasing, while the threshold current is allowed to be reduced.

The semiconductor laser 300 has an oscillating wavelength of 0.65 μm when the oscillating wavelength is designed to be at 0.65 μm. Thus, the oscillating wavelength is controlled satisfactorily.

In the case where the conventional semiconductor laser 1700 (FIG. 24; indicated as conventional 1 in Table 1) is fabricated to have the first guide layer 1704 and the second guide layer 1706 each having a forbidden band width equal to that of the quantum barrier layer 1711 (i.e., Al mole fraction of 0.5 in the first and the second guide layer 1704 and 1706), the oscillating wavelength can be shifted to 0.64 μm with respect to the designed value of 0.65 μm. Thus, it is difficult to control the oscillating wavelength satisfactorily. Such shifting occurs because of the fact that the dopant in the p-type second cladding layer 1707 is likely to diffuse to the MQW active layer 1705. The Al mole fraction in the quantum well layers 1710 thus changes, resulting in the wavelength shift.

The degree of dopant diffusion depends on the constituent material of cladding layers. For example, in the case of the AlGaInP-type cladding layers, the dopant in a p-type cladding layer is more likely to diffuse than the dopant in the AlGaAs-type cladding layer. According to the present invention, the wavelength is prevented from shifting more effectively, even in such a case, by setting the forbidden band width of the second guide layer provided on the side of the p-type second cladding layer to be smaller than that of the quantum barrier layers so as to restrict the dopant diffusion to the MQW active layer 305.

EXAMPLE 4

Figure 7:
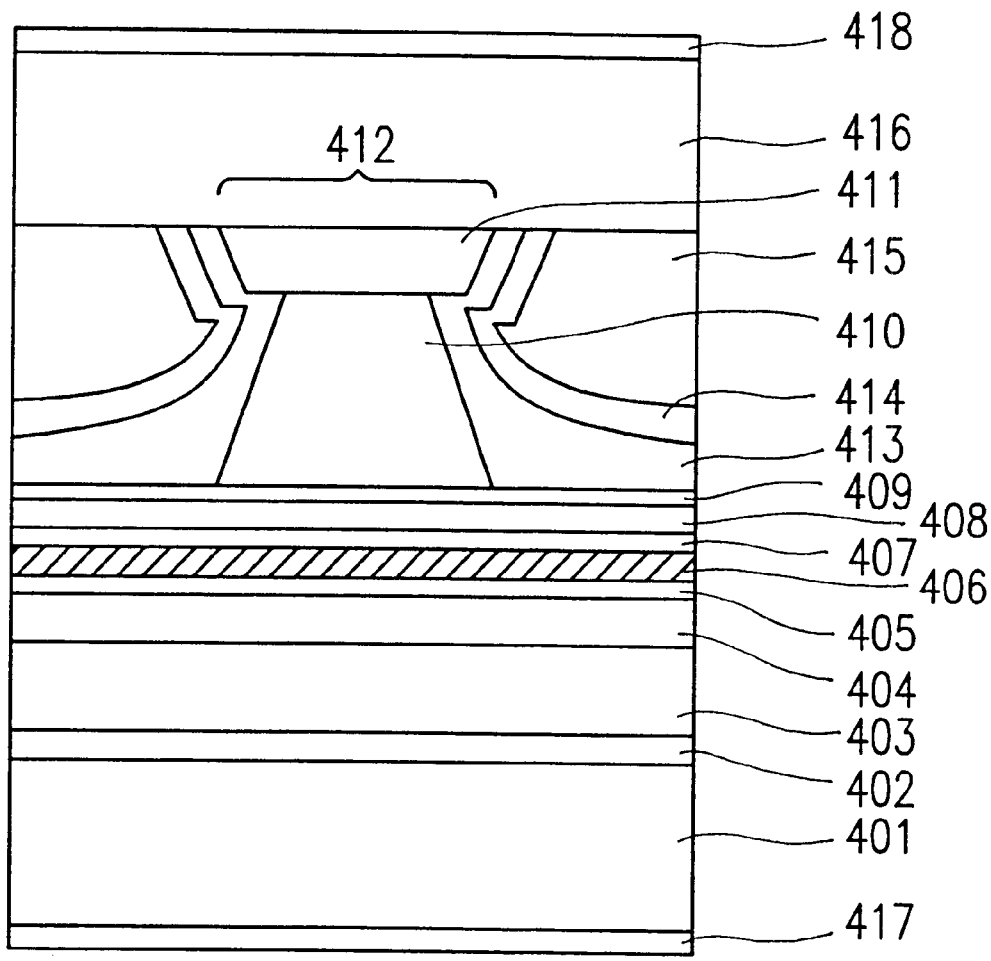
FIG. 7 is a cross-sectional view of a semiconductor laser in a fourth example according to the present invention.

FIG. 7 is a cross-sectional view of a semiconductor laser 400 in a fourth example according to the present invention.

As shown in FIG. 7, the semiconductor laser 400 includes an n-type GaAs substrate 401, an n-type GaAs buffer layer 402 having a thickness of, for example, about 0.5 μm, an n-type $Al_{0.5}Ga_{0.5}As$ first cladding layer 403 having a thickness of, for example, about 1.2 μm, an n-type $Al_{0.48}Ga_{0.52}As$ second cladding layer 404 having a thickness of, for example, about 0.2 μm, an $Al_{0.27}Ga_{0.72}As$ first guide layer 405 having a thickness of, for example, about 5 nm, a non-doped MQW active layer 406, an $Al_{0.27}Ga_{0.73}As$ second guide layer 407 having a thickness of, for example, about 5 nm, a p-type $Al_{0.5}Ga_{0.5}As$ third cladding layer 408 having a thickness of, for example, about 0.15 μm, a p-type GaAs etching stop layer 409 having a thickness of, for example, about 0.002 μm, a p-type $Al_{0.5}Ga_{0.5}As$ fourth cladding layer 410 having a thickness of, for example, about 1.0 μm, and a p-type GaAs cap layer 411 having a thickness of, for example, about 0.8 μm. On the n-type GaAs substrate 401, these layers are sequentially provided by MOCVD.

Although not shown, the MQW active layer 406 includes eight $Al_{0.13}Ga_{0.87}As$ quantum well layers each having a thickness of, for example, about 10 nm and seven $Al_{0.35}Ga_{0.65}As$ quantum barrier layers each having a thickness of, for example, about 5 nm, which are provided alternately.

The n-type $Al_{0.48}Ga_{0.52}As$ second cladding layer 404 is used for controlling the radiation angle in the vertical direction and does not influence the effect of the present invention.

After a layered structure including the above-described layers is provided, a stripe mask formed of a photoresist is provided on a surface of the layered structure, and selective etching is performed until being stopped at a surface of the p-type GaAs etching stop layer 409. Thus, the ridge stripe 412 having a bottom width of, for example, about 2.2 μm is formed.

Next, an n-type $Al_{0.7}Ga_{0.3}As$ first current and light confinement layer 413 having a thickness of, for example, about 0.6 μm, an n-type GaAs second current confinement layer 414 having a thickness of, for example, about 0.3 μm, and a p-type GaAs planarizing layer 415 having a thickness of, for example, about 0.3 μm are sequentially grown on the etching stop layer 409 by MOCVD so as to bury both sides of the ridge stripe 412.

Then, a p-type GaAs contact layer 416 is grown to a thickness of, for example, about 3 μm by MOCVD so as to cover a surface of the p-type GaAs cap layer 411 and a surface of the p-type GaAs planarizing layer 415. An n-side electrode 417 is provided on a surface of the n-type GaAs substrate 401, and a p-side electrode 418 is provided on a surface of the p-type GaAs contact layer 416. The cavity length is adjusted to 200 μm by cleaving. An $Al_2O_3$ layer and an Si layer are provided on each of end faces of the cavity, so that a light reflectance on a light emitting face of the cavity is 30% and a light reflectance on a rear face of the cavity is 75%.

When a forward voltage was applied between the n-side electrode 417 and the p-side electrode 418 of the semiconductor laser 400, an operating current of 19 mA and an operating voltage of 1.8 V were obtained under the conditions of an oscillating wavelength of 0.78 μm, a threshold current of 15 mA, a slope efficiency of current vs. optical output characteristic of 0.75 W/A, and an optical output of 3 mW.

In the semiconductor laser 400 in the fourth example, self-sustaining pulsation occurs; i.e., laser oscillation light oscillates in the form of pulses due to the saturable absorption effect of a portion of the MQW active layer 406 which is not covered by the ridge stripe 412. In the self-sustaining pulsation condition, the longitudinal mode of the laser becomes multiple modes, and thus the spectral line width of each of the longitudinal modes is enlarged. Therefore, coherency of the laser is reduced and is not influenced by the returning light, resulting in reduced noise.

In the semiconductor laser 400, the astigmatic difference, i.e., the positional difference between the minimum spot position of the radiation light in the horizontal direction and that in the vertical direction with respect to the MQW active layer 406, is, for example, about 5 μm.

On the other hand, in the case where the conventional semiconductor laser 1700 (FIG. 24) is fabricated to have the first guide layer 1704 and the second guide layer 1706 each having a forbidden band width equal to that of the quantum barrier layer 1711 (i.e., Al mole fraction of 0.35 in the first and the second guide layer 1704 and 1706), the astigmatic difference is as large as 15 μm. When the astigmatic difference is increased, the size of the light spot converged by a lens increases. Such an increased size of light spot is difficult to be used, for example, in an optical disk system.

The semiconductor laser 400 in the fourth example according to the present invention increases the amount of saturable absorption in a portion of the quantum well layers of the MQW active layer 406 which is not covered by the ridge stripe 412 with the quantum well layers being adjacent to the first and second guide layers 405 and 407. Accordingly, self-sustaining pulsation is realized while the light is confined in a portion of the MQW active layer 406 which is covered by the ridge stripe 412. In consequence, there exists less influence due to the wave front caused by the saturable absorption effect in the portion of the MQW active layer 406 which is not covered by the ridge stripe 412. Therefore, the position shift of the radiation light spot in the horizontal direction to the MQW active layer 406 becomes smaller, thereby improving the astigmatic difference. The optical characteristics of the semiconductor laser 400 are thus improved.

Figure 8:
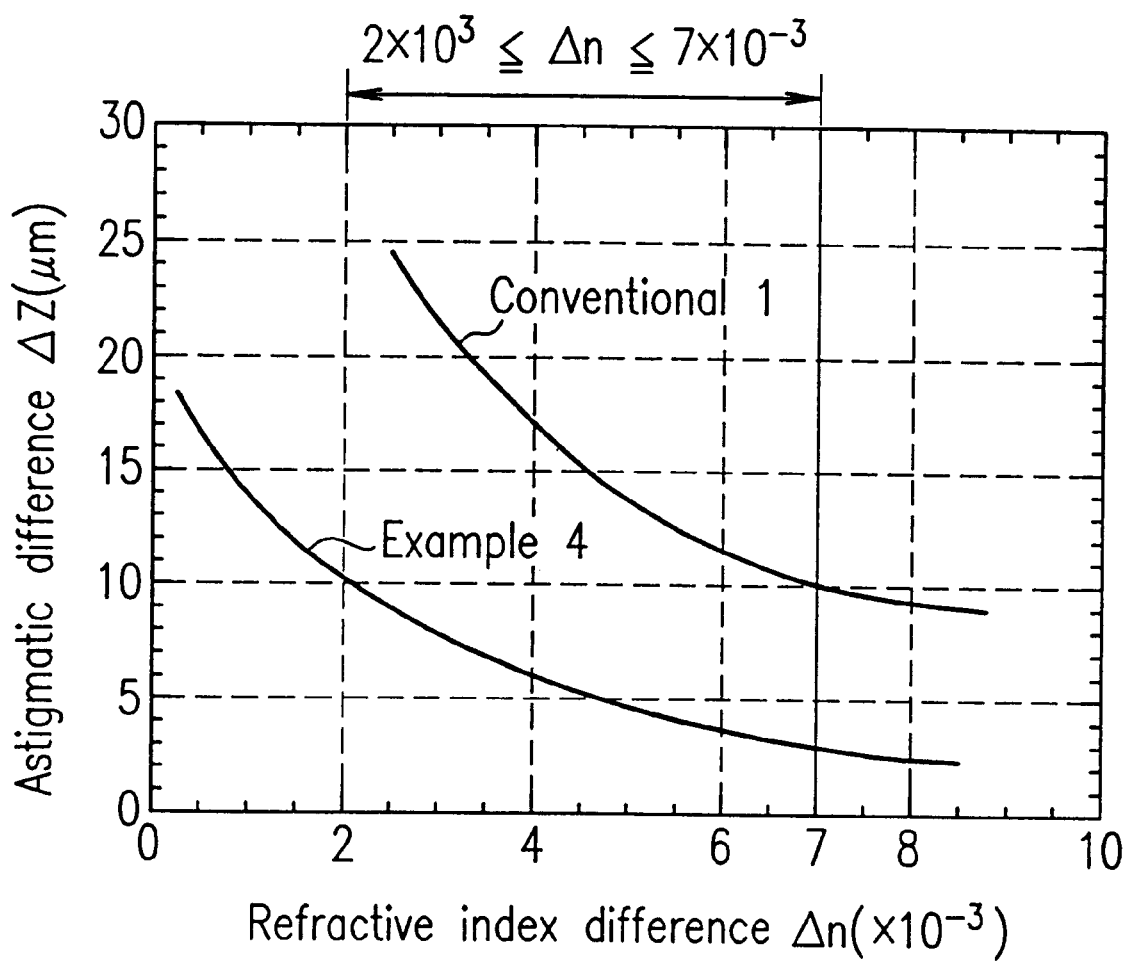
FIG. 8 is a graph illustrating the relationship between the refractive index difference and the astigmatic difference of semiconductor lasers.

FIG. 8 illustrates the relationship between the refractive index difference ($\Delta n$) and the astigmatic difference ($\Delta Z$) of the semiconductor laser 400 shown in FIG. 7 and the previously-described conventional semiconductor laser 1700. The refractive index difference ($\Delta n$) represents the difference between the refractive index $n_a$ of light confined in the portion of the MQW active layer which is covered by the ridge stripe and the refractive index $n_b$ of light confined in the portion of the MQW active layer which is not covered by the ridge stripe. Based on the relationship shown in FIG. 8, it is understood that the refractive index difference depends on the astigmatic difference and that the astigmatic difference ($\Delta Z$) is more suppressed in the semiconductor laser 400 than in the conventional semiconductor laser 1700.

In order to cause self-sustaining pulsation, the refractive index ($\Delta n$) is required to be $7 \times 10^{-3}$ or less so as to allow the light to leak to the portion of the MQW active layer which is not covered by the ridge stripe. The astigmatic difference ($\Delta Z$) tends to increase as the refractive index difference ($\Delta n$) reduces. In order to restrict the astigmatic difference ($\Delta Z$) of a semiconductor laser having the structure of the fourth example to 10 μm or less, the refractive index difference ($\Delta n$) is required to be $2 \times 10^{-3}$ or more. The semiconductor laser 400 of the present example, which is a self-sustaining pulsation-type low noise semiconductor laser having an astigmatic difference of 10 μm or less and other satisfactory optical characteristics, is realized by setting the refractive index difference ($\Delta n$) in a range fulfilling the conditions represented by expression (1).

$$2 \times 10^{-3} \leq \Delta n \leq 7 \times 10^{-3} \quad (1)$$

In the conventional semiconductor laser 1700, the astigmatic difference ($\Delta Z$) is greater than 10 μm when the refractive index difference ($\Delta n$) is in the range of $7 \times 10^{-3}$ or less, which is required to cause self-sustaining pulsation. Accordingly, the conventional semiconductor laser 1700 cannot cause self-sustaining pulsation at a smaller astigmatic difference.

EXAMPLE 5

Figure 9:
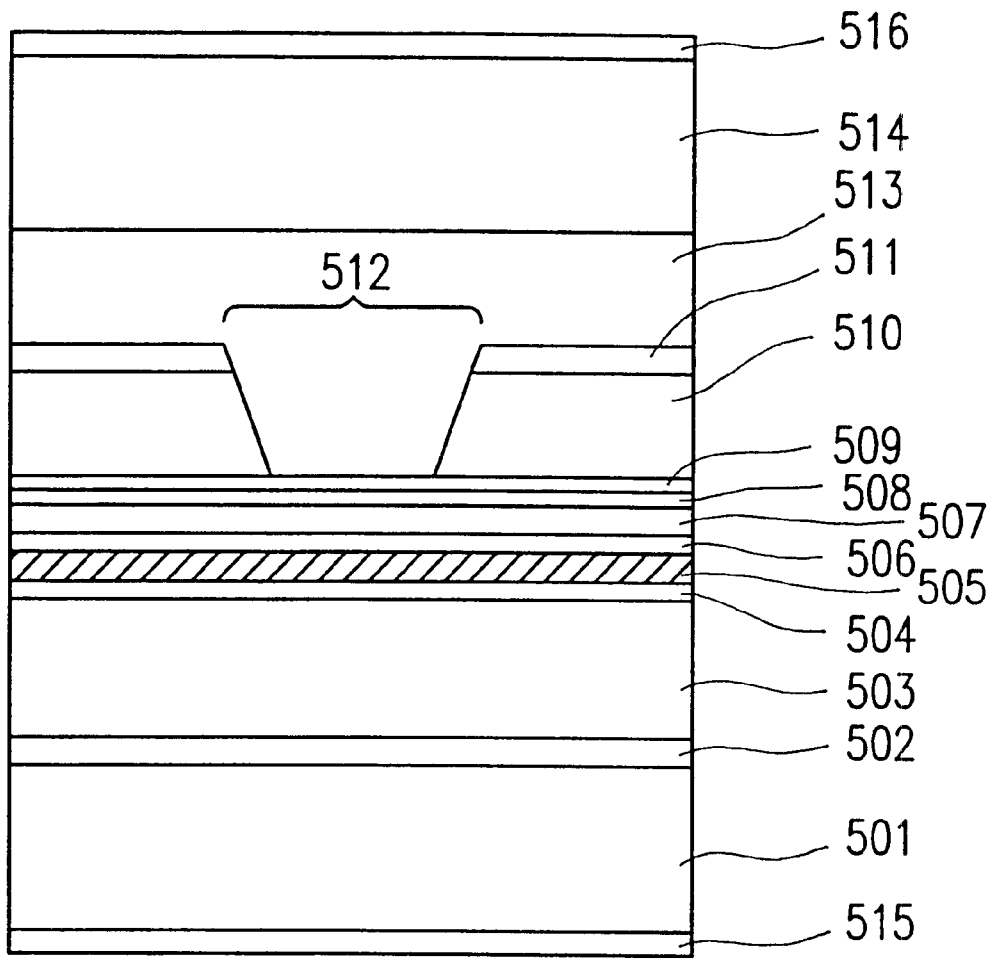
FIG. 9 is a cross-sectional view of a semiconductor laser in a fifth example according to the present invention.
Figure 10:
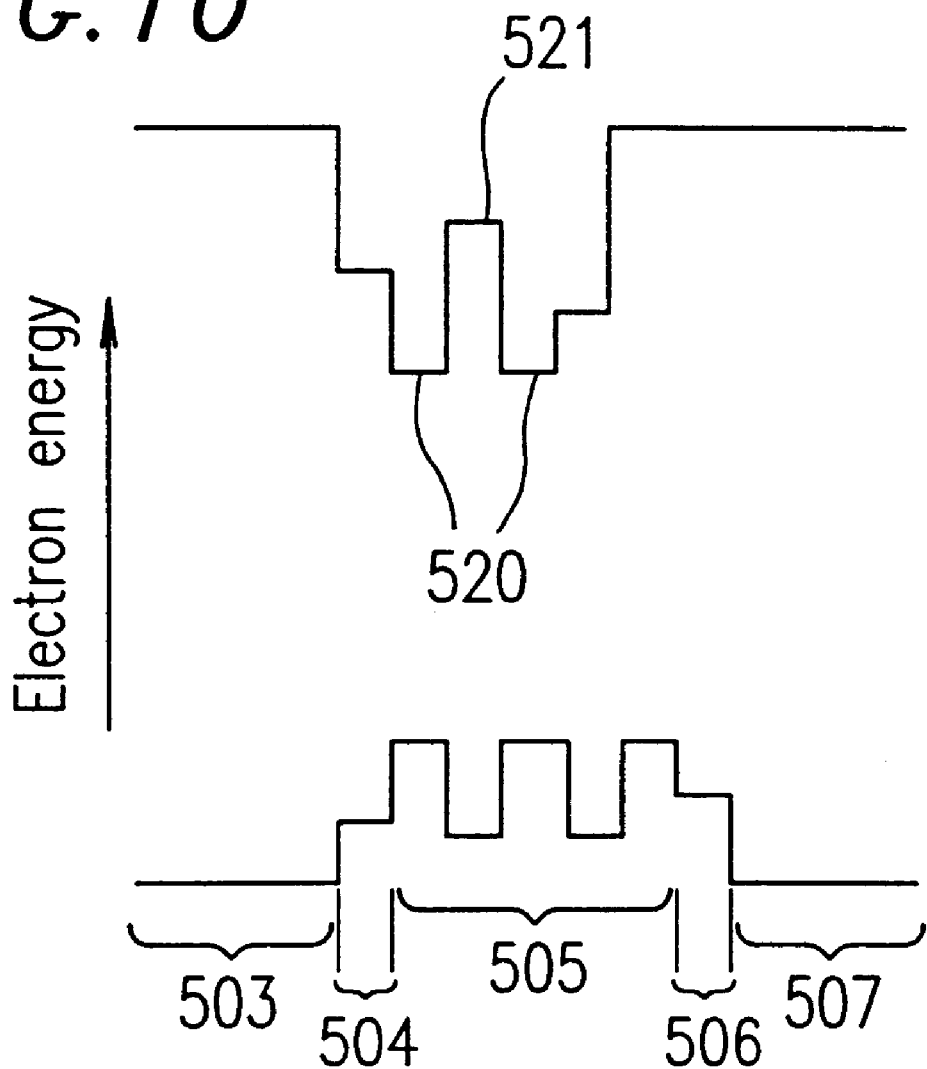
FIG. 10 is an energy band diagram of an active layer and the vicinity thereof of the semiconductor laser shown in FIG. 9.

FIG. 9 is a cross-sectional view of a semiconductor laser 500 in a fifth example according to the present invention, and FIG. 10 is an energy band diagram of an active layer and the vicinity thereof of the semiconductor laser 500.

As shown in FIG. 9, the semiconductor laser 500 includes an n-type GaAs substrate 501, an n-type GaAs buffer layer 502 having a thickness of, for example, about 0.5 μm, an n-type $Al_{0.5}Ga_{0.5}As$ first cladding layer 503 having a thickness of, for example, about 1.5 μm, an $Al_{0.3}Ga_{0.7}As$ first guide layer 504 having a thickness of, for example, about 15 nm, a non-doped MQW active layer 505, an $Al_{0.25}Ga_{0.75}As$ second guide layer 506 having a thickness of, for example, about 15 nm, a p-type $Al_{0.5}Ga_{0.5}As$ second cladding layer 507 having a thickness of, for example, about 0.2 μm, a p-type GaAs first etching stop layer 508 having a thickness of, for example, about 0.003 μm, a p-type $Al_{0.6}Ga_{0.4}As$ second etching stop layer 509 having a thickness of, for example, about 0.01 μm, an n-type $Al_{0.5}Ga_{0.5}As$ current and light confinement layer 510 having a thickness of, for example, about 1.0 μm, and an n-type GaAs cap layer 511 having a thickness of, for example, about 0.8 μm. On the n-type GaAs substrate 501, these layers are sequentially provided by MOCVD.

As shown in FIG. 10, the MQW active layer 505 includes two $Al_{0.1}Ga_{0.9}As$ quantum well layers 520 each having a thickness of, for example, about 8 nm and one $Al_{0.35}Ga_{0.65}As$ quantum barrier layer 521 each having a thickness of, for example, about 5 nm, which are provided alternately.

Returning to FIG. 9, the p-type GaAs first etching stop layer 508 and the p-type $Al_{0.6}Ga_{0.4}As$ second etching stop layer 509, which are both very thin, do not influence the light confinement or inner light absorption.

After a layered structure including the above-described layers is provided, a stripe window formed of a photoresist is provided on a surface of the layered structure, and selective etching is performed until being stopped at a surface of the p-type GaAs first etching stop layer 508. Thus, the stripe groove 512 having a bottom width of, for example, about 2.5 μm is formed.

Next, a p-type $Al_{0.5}Ga_{0.5}As$ third cladding layer 513 having a thickness of, for example, about 1.5 μm and a p-type GaAs contact layer 514 having a thickness of, for example, about 2 μm are sequentially grown on the first etching stop layer 508 by MOCVD so as to bury the stripe groove 512.

An n-side electrode 515 is provided on a surface of the n-type GaAs substrate 501, and a p-side electrode 516 is provided on a surface of the p-type GaAs contact layer 514. The cavity length is adjusted to 375 μm by cleaving. An $Al_2O_3$ layer and an Si layer are provided on each of end faces of the cavity, so that a light reflectance on a light emitting face of the cavity is 30% and a light reflectance on a rear face of the cavity is 95%.

When a forward voltage was applied between the n-side electrode 515 and the p-side electrode 516 of the semiconductor laser 500, an operating current of 14 mA and an operating voltage of 1.7 V were obtained under the conditions of an oscillating wavelength of 0.78 μm, a threshold current of 10 mA, a slope efficiency of current vs. optical output characteristic of 0.75 W/A, and an optical output of 3 mW.

In the semiconductor laser 500, the first and second guide layers 504 and 506 are adjacent to the quantum well layers 520, and the forbidden band width of each of the first and second guide layers 504 and 506 is larger than that of the quantum well layers 520 but smaller than that of the quantum barrier layer 521. In addition, the forbidden band width of the first guide layer 504 and the forbidden band width of the second guide layer 506 are different from each other.

The difference in forbidden band width between the first and second guide layers 504 and 506 means a difference in the Al mole fraction between the first and second guide layers 504 and 506. In this state, the radiation angle vertical to the MQW active layer 505 is 25 degrees. When the first and second guide layers have an equal forbidden band width (i.e., the first and second guide layers has an equal Al mole fraction of 0.25), the radiation angle vertical to the MQW active layer is 30 degrees. The characteristics of radiated light are thus allowed to be controlled by appropriately setting the Al mole fraction in the first and second guide layers 504 and 506 in this manner.

EXAMPLE 6

Figure 11:
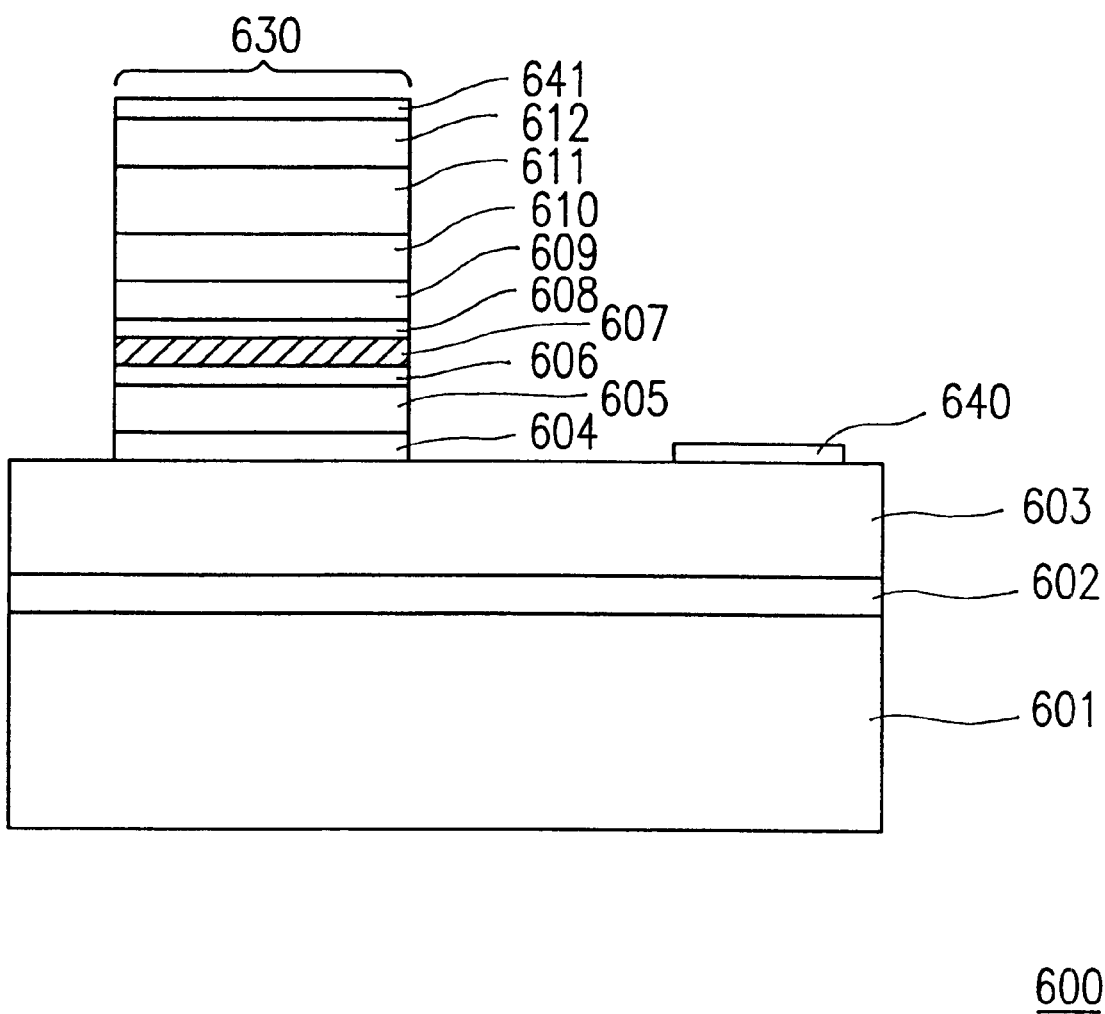
FIG. 11 is a cross-sectional view of a semiconductor laser in a sixth example according to the present invention.
Figure 12:
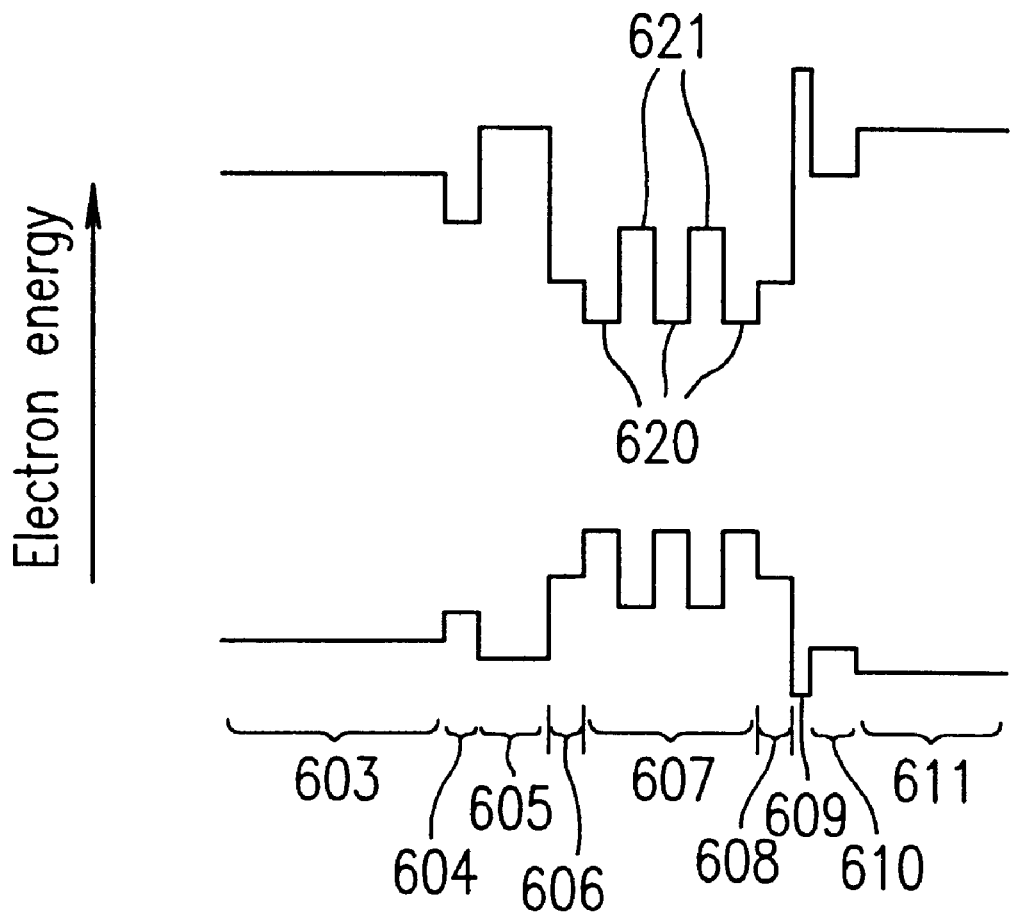
FIG. 12 is an energy band diagram of an active layer and the vicinity thereof of the semiconductor laser shown in FIG. 11.

FIG. 11 is a cross-sectional view of a semiconductor laser 600 in a sixth example according to the present invention, and FIG. 12 is an energy band diagram of an active layer and the vicinity thereof of the semiconductor laser 600.

As shown in FIG. 11, the semiconductor laser 600 includes a sapphire substrate 601, a GaN buffer layer 602 having a thickness of, for example, about 0.05 $\mu$m, an n-type GaN first cladding layer 603 having a thickness of, for example, about 3 $\mu$m, an n-type $In_{0.05}Ga_{0.95}N$ second cladding layer 604 having a thickness of, for example, about 1.0 $\mu$m, an n-type $Al_{0.05}Ga_{0.95}N$ third cladding layer 605 having a thickness of, for example, about 0.5 $\mu$m, a non-doped $In_{0.1}Ga_{0.9}N$ first guide layer 606 having a thickness of, for example, about 20 nm, a non-doped MQW active layer 607, a non-doped $In_{0.1}Ga_{0.9}N$ second guide layer 608 having a thickness of, for example, about 20 nm, a p-type $Al_{0.2}Ga_{0.8}N$ fourth cladding layer 609 having a thickness of, for example, about 20 nm, a p-type GaN fifth cladding layer 610 having a thickness of, for example, about 0.1 $\mu$m, a p-type $Al_{0.05}Ga_{0.95}N$ sixth cladding layer 611 having a thickness of, for example, about 0.5 $\mu$m, and a p-type GaN contact layer 612 having a thickness of, for example, about 0.2 $\mu$m. On the sapphire substrate 601, these layers are sequentially provided by MOCVD.

As shown in FIG. 12, the MQW active layer 607 includes three $In_{0.2}Ga_{0.8}N$ quantum well layers 620 each having a thickness of, for example, about 4 nm and two $In_{0.05}Ga_{0.95}N$ quantum barrier layers 621 each having a thickness of, for example, about 5 nm, which are provided alternately.

Returning to FIG. 11, after a layered structure including the above-described layers is provided, a stripe mask formed of a photoresist is provided on a surface of the layered structure, and a ridge stripe 630 having a width of, for example, about 2 $\mu$m is formed by dry etching. An n-side electrode 640 is provided on a surface of the n-type GaN first cladding layer 603, and a p-side electrode 641 is provided on a surface of the p-type GaN contact layer 612. The cavity length is adjusted to 700 $\mu$m by cleaving. Each of end faces of the cavity is coated with a dielectric layer, so that a light reflectance both on a light emitting face and a rear face of the cavity is 30%.

When a forward voltage was applied between the n-side electrode 640 and the p-side electrode 641 of the semiconductor laser 600, an operating voltage of 6 V, an oscillating wavelength of 0.41 $\mu$m, a threshold current of 100 mA, and a slope efficiency of current vs. optical output characteristic of 0.2 W/A were obtained.

In the semiconductor laser of the present invention, the first and second guide layers 606 and 608 are adjacent to the quantum well layers 620, and the forbidden band width of the first and second guide layers 606 and 608 is larger than that of the quantum well layers 620 but smaller than that of the quantum barrier layers 621. In addition, the forbidden band width of the first and second guide layers 606 and 608 is set at an intermediate level between the forbidden band width of the quantum well layers 620 and that of the quantum barrier layers 621.

Each of the semiconductor layers has the relationship between the composition ratio and the forbidden band such that as the In mole fraction therein increases, the forbidden band width thereof reduces while the refractive index thereof increases. Furthermore, as the Al mole fraction of each semiconductor layer increases, the forbidden band width of that layer increases while refractive index thereof reduces.

In the sixth example, the first and second guide layers 606 and 608 are formed of non-doped InGaN. Accordingly, the first and second guide layers 606 and 608 prevents the dopant in the n-type third cladding layer 605 and the p-type fourth cladding layer 608 from diffusing into the MQW active layer 607. Thus, the shift of oscillating wavelength otherwise caused by a change in a composition ratio is prevented.

Moreover, since the first and second guide layers 606 and 608 are formed of InGaN and have a forbidden band width at the intermediate level between those of the quantum well layers 620 and the quantum barrier layers 621, the refractive index of the first and second guide layers 606 and 608 is increased. Accordingly, the light confinement ratio into the MQW active layer 607 is increased while suppressing an increase in the operating voltage, thereby reducing the threshold current.

In the case of the conventional semiconductor laser 1700 (FIG. 24), the first guide layer 1704 and the second guide layer 1706 are formed of n-type or p-type GaN. Accordingly, the dopant diffuses into the MQW active layer 1705 to cause the shift of oscillating wavelength. When the first guide layer and the second guide layer are formed of a non-doped material in order to solve this problem, the operating voltage is undesirably increased.

In the previous examples, the forbidden band width of each of the first and second guide layers is smaller than that of the quantum barrier layers. Alternatively, either one of the first guide layer or the second guide layer can have a forbidden band width smaller than that of the quantum barrier layers.

The present invention is not limited to the specific values set forth previously regarding various parameters such as the layer thicknesses, the Al mole fraction, the In mole fraction, the carrier concentration and the like, and is applicable to other conditions with different parameter values.

Growth methods other than MOCVD or MBE, such as, for example, LPE, gas source MBE, ALE are usable.

EXAMPLE 7

Figure 13:
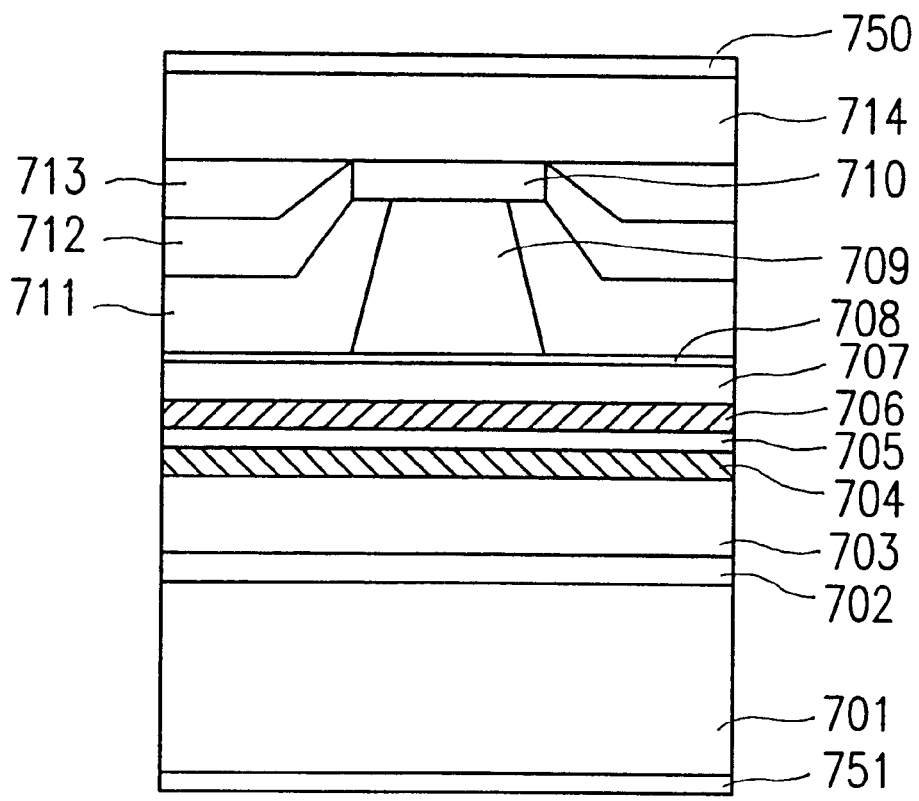
FIG. 13 is a cross-sectional view of a semiconductor laser in a seventh example according to the present invention.
Figure 14:
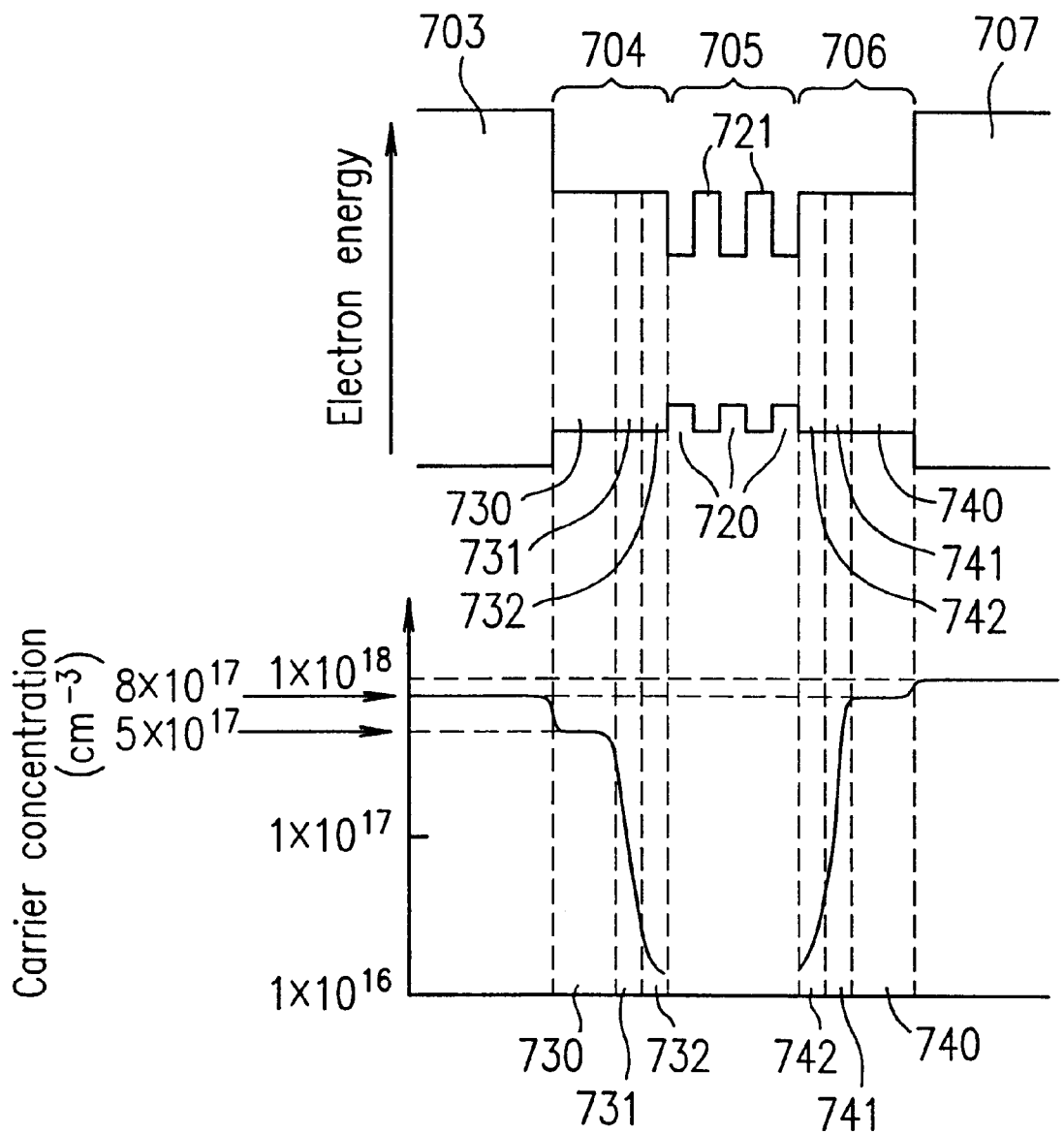
FIG. 14 is an energy band diagram, which also illustrates the carrier concentration distribution, of an active layer and the vicinity thereof of the semiconductor laser shown in FIG. 13.

FIG. 13 is a cross-sectional view of a semiconductor laser 700 in a seventh example according to the present invention, and FIG. 14 is an energy band diagram of an active layer and the vicinity thereof of the semiconductor laser 700.

As shown in FIG. 13, the semiconductor laser 700 includes an n-type GaAs substrate 701, an n-type GaAs buffer layer 702, an n-type $Al_{0.5}Ga_{0.5}As$ first cladding layer 703, an $Al_{0.35}Ga_{0.65}As$ first optical guide layer 704, a non-doped MQW active layer 705, an $Al_{0.35}Ga_{0.65}As$ second optical guide layer 706, a p-type $Al_{0.5}Ga_{0.5}As$ second cladding layer 707, and a p-type GaAs etching stop layer 708. On the n-type GaAs substrate 701, these layers are sequentially provided. In central surface area of the p-type GaAs etching stop layer 708, a p-type $Al_{0.5}Ga_{0.5}As$ third cladding layer 709 and a p-type GaAs cap layer 710, which form a ridge stripe, are provided. An n-type $Al_{0.7}Ga_{0.3}As$ current and light confinement layer 711, an n-type GaAs current blocking layer 712, and a p-type GaAs planarizing layer 713 are sequentially provided on the etching stop layer 708 so as to sandwich the ridge stripe. A p-type GaAs contact layer 714 is provided on a surface of the p-type GaAs cap layer 710 and a surface of the p-type GaAs planarizing layer 713. A p-side electrode 750 is provided on a surface of the p-type GaAs contact layer 714, and an n-side electrode 751 is provided on a surface of the n-type GaAs substrate 701 which does not have the above-described semiconductor layers provided thereon.

The semiconductor laser 700 having the above-described structure is fabricated by, for example, the following manner.

On the n-type GaAs substrate 701, the following layers are grown by performing the first MOCVD process: the n-type GaAs buffer layer 702 (thickness: about 0.5 $\mu$m; dopant: Si; carrier concentration: about $1\times10^{18}$ $cm^{-3}$), the n-type $Al_{0.5}Ga_{0.5}As$ first cladding layer 703 (thickness: about 1.5 $\mu$m; dopant: Si; carrier concentration: about $8\times10^{17}$ $cm^{-3}$), the $Al_{0.35}Ga_{0.65}As$ first optical guide layer 704, the non-doped MQW active layer 705, the $Al_{0.35}Ga_{0.65}As$ second optical guide layer 706, the p-type $Al_{0.5}Ga_{0.5}As$ second cladding layer 707 (thickness: about 0.25 $\mu$m; dopant: Zn; carrier concentration: about $1\times10^{18}$ $cm^{-3}$), the p-type GaAs etching stop layer 708 (thickness: about 0.003 $\mu$m; dopant: Zn; carrier concentration: about $1\times10^{18}$ $cm^{-3}$), the p-type $Al_{0.5}Ga_{0.5}As$ third cladding layer 709 (thickness: about 1.0 $\mu$m; dopant: Zn; carrier concentration: about $2\times10^{18}$ $cm^{-3}$), and the p-type GaAs cap layer 710 (thickness: about 0.7 $\mu$m; dopant: Zn; carrier concentration: about $3\times10^{18}$ $cm^{-3}$).

As shown in FIG. 14, the MQW active layer 705 is formed by alternately growing three $Al_{0.12}Ga_{0.88}As$ quantum well layers 720 each having a thickness of, for example, about 0.008 $\mu$m and two $Al_{0.35}Ga_{0.65}As$ quantum barrier layers 721 each having a thickness of, for example, about 0.005 $\mu$m, so that each well layer 720 is interposed between the adjacent barrier layers 721. The first optical guide layer 704 is formed by sequentially growing an impurity-doped layer (thickness: about 0.03 $\mu$m; dopant: Si; carrier concentration: about $5\times10^{17}$ $cm^{-3}$) and a non-impurity-doped layer (thickness: about 0.02 $\mu$m) on the n-type first cladding layer 703. The second optical guide layer 706 is formed by sequentially growing a non-impurity-doped layer (thickness: about 0.02 $\mu$m) and an impurity-doped layer (thickness: about 0.03 $\mu$m; dopant: Zn; carrier concentration: about $8\times10^{17}$ $cm^{-3}$) on the MQW active layer 705.

Returning to FIG. 13, the cap layer 710 is patterned into a convex stripe having a top width of, for example, about 2 $\mu$m by etching using a stripe mask formed of a photoresist as an etching mask. The p-type third cladding layer 709 is then patterned into a ridge stripe having a bottom width of, for example, about 2.5 $\mu$m by etching using the cap layer striped-patterned cap layer 710 as an etching mask. The etching is stopped by the etching stop layer 708. After the etching, the photoresist is removed.

Next, the following layers are grown so as to bury both sides of the ridge stripe by performing the second MOCVD process: the n-type $Al_{0.7}Ga_{0.3}As$ current and light confinement layer 711 (thickness: about 0.6 $\mu$m; dopant: Si; carrier concentration: about $1\times10^{18}$ $cm^{-3}$), the n-type GaAs current blocking layer 712 (thickness: about 0.3 $\mu$m; dopant: Si; carrier concentration: about $1\times10^{18}$ $cm^{-3}$), and the p-type GaAs planarizing layer 713 (thickness: about 0.3 $\mu$m; dopant: Zn; carrier concentration: about $1\times10^{18}$ $cm^{-3}$).

Then, unnecessary portions of the above-described layers which are on the cap layer 710 are removed by etching and the thickness of the cap layer 710 is adjusted to be, for example, about 0.3 $\mu$m. The p-type GaAs contact layer 713 (thickness: about 3 $\mu$m; dopant: Zn; carrier concentration: about $1\times10^{19}$ $cm^{-3}$) are then grown on the cap layer 710 and the planarizing layer 713 by performing the third MOCVD process.

The thermal hysteresis temperature (i.e., the crystal grown temperature) during the MOCVD growth processes is set at about 600° C. to 800° C. Due to such a crystal grown temperature, impurities in the first and second optical guide layers 704 and 706 diffuse from the impurity-doped layer to the non-impurity-doped layer. As a result, the MQW active layer 705 and the vicinity thereof exhibits the band diagram and carrier concentration shown in FIG. 14.

As can be appreciated from FIG. 14, the first optical guide layer 704 is divided into an impurity-doped region 730 (thickness: about 0.03 $\mu$m), an intermediate impurity concentration region 731 (thickness: about 0.01 $\mu$m), and an impurity-scarce region 732 (thickness: about 0.01 $\mu$m), which are located in this order from the side of the n-type first cladding layer 703. The impurity concentration of the impurity-scarce region 732 is 1/5 or less than that of the impurity-doped region 730. The second optical guide layer 706 is divided into an impurity-doped region 740 (thickness: about 0.03 $\mu$m), an intermediate impurity concentration region 741 (thickness: about 0.01 $\mu$m), and an impurity-scarce region 742 (thickness: about 0.01 $\mu$m), which are located in this order from the side of the p-type second cladding layer 707. The impurity concentration of the impurity-scarce region 742 is 1/5 or less than that of the impurity-doped region 740. In this manner, the impurity-doped regions 730 and 740, the intermediate impurity concentration regions 731 and 741, and the impurity-scarce regions 732 and 742 are formed through a simple fabrication process with satisfactory controllability by utilizing thermal hysteresis during the growth of the semiconductor layers.

Thereafter, the p-side electrode 750 is formed on the p-type GaAs contact layer 714, and the n-side electrode 751 is formed on the n-type GaAs substrate 701. The cavity length is adjusted to 375 $\mu$m by cleaving. A light emitting face of the cavity is coated with a single $Al_2O_3$ layer so that a light reflectance thereon is 10%, while a rear face of the cavity is subjected to a multiple-layer coating with an $Al_2O_3$ layer and an Si layer so that a light reflectance thereon is 75%.

The semiconductor laser 700 fabricated in this manner was operated at an optical output of 4 mW at room temperature. The characteristics obtained in such conditions are shown in Table 3. For the purpose of comparison, the characteristics of different semiconductor lasers are also shown in Table 3. Comparative example 1 refers to a semiconductor laser fabricated in the same manner as in the seventh example except that no impurity was added in the optical guide layers. Comparative example 2 refers to a semiconductor laser fabricated in the same manner as in the seventh example except that impurities were added to the entire optical guide layers.

TABLE 3

|  | Operating current | Operating voltage | Resistance |
|---|---|---|---|
| Example 1 | 20 mA | 1.80 V | 5 ohms |
| Comparative example 1 | 20 mA | 2.10 V | 15 ohms |
| Comparative example 2 | 25 mA | 1.80 v | 5 ohms |

As can be appreciated from Table 3, in the semiconductor laser 700 in the seventh example, the operating voltage, the operating current and the resistance are all reduced. In the case of comparative example 1 in which no impurity was added to the optical guide layers, the operating current is reduced but the resistance is increased due to an increased resistance in the optical guide layers. The operating voltage is also increased due to the potential barrier generated between the cladding layers and the optical guide layers. In the case of comparative example 2 in which impurities were added to the entire optical guide layers, the operating voltage and the resistance are reduced but the operating current is increased since the laser characteristics are deteriorated by impurity diffusion from the optical guide layers to the MQW active layer during the operation.

Figure 15:
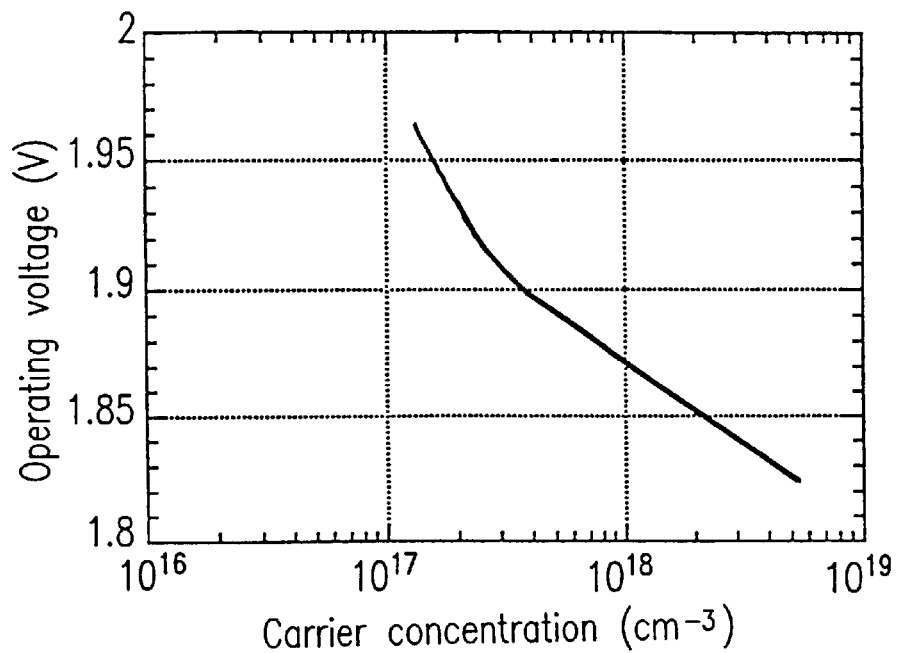
FIG. 15 is a graph illustrating the carrier concentration in an impurity-doped region of a second optical guide layer and the operating voltage of the semiconductor laser shown in FIG. 13.
Figure 16:
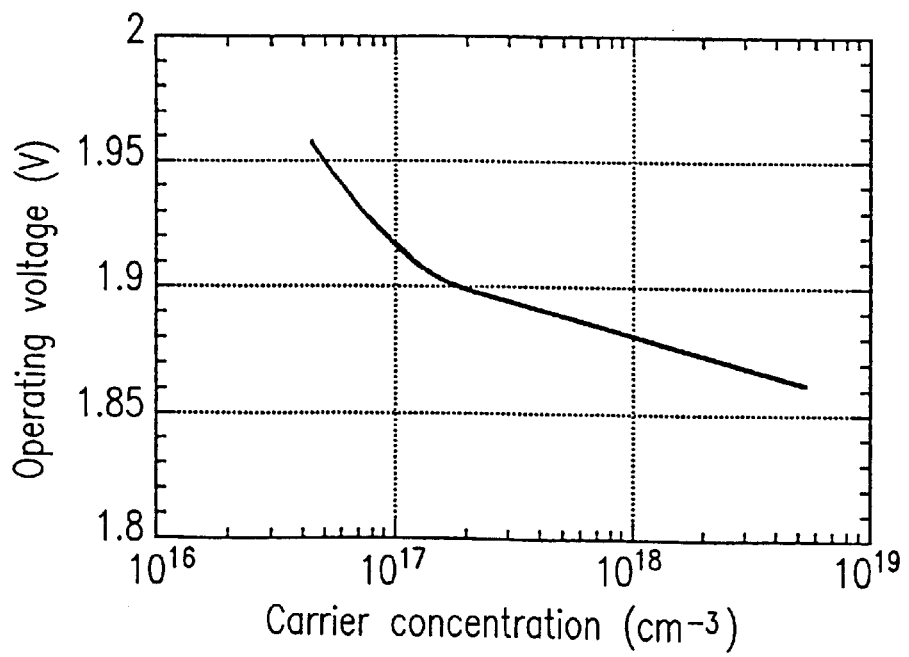
FIG. 16 is a graph illustrating the carrier concentration in an impurity-doped region of a first optical guide layer and the operating voltage of the semiconductor laser shown in FIG. 13.

FIG. 15 illustrates changes in the operating voltage measured when the carrier concentration of the impurity-doped region 730 (FIG. 14) of the first optical guide layer 704 was fixed at $5 \times 10^{17}$ cm$^{-3}$ while the carrier concentration of the impurity-doped region 740 (FIG. 14) of the second optical guide layer 706 was changed. FIG. 16 illustrates changes in the operating voltage measured when the carrier concentration of the impurity-doped region 740 (FIG. 14) of the second optical guide layer 706 was fixed at $8 \times 10^{17}$ cm$^{-3}$ while the carrier concentration of the impurity-doped region 730 (FIG. 14) of the first optical guide layer 704 was changed.

As can be appreciated from FIGS. 15 and 16, the operating voltage is reduced as the carrier concentration of the impurity-doped region increases.

For example, the carrier concentration of the impurity-doped region 730 (FIG. 14) of the first optical guide layer 704 is preferably set at $2 \times 10^{17}$ cm$^{-3}$ or more as shown in FIG. 16, which reduces the operating voltage to 1.9 V or less. The upper limit of the carrier concentration of the impurity-doped region 730 is preferably set at $1 \times 10^{18}$ cm$^{-3}$, since an excessively high carrier concentration generates a non-emission center inherent to n-type impurities, which lowers the light emission efficiency in the first optical guide layer 704, thereby deteriorating the laser characteristics.

The carrier concentration of the impurity-doped region 740 (FIG. 14) of the second optical guide layer 706 is preferably set at $4 \times 10^{17}$ cm$^{-3}$ or more as shown in FIG. 15, which reduces the operating voltage to 1.9 V or less. The upper limit of the carrier concentration of the impurity-doped region 740 is preferably set at $1.2 \times 10^{18}$ cm$^{-3}$, since an excessively high carrier concentration allows the current to spread too much in the second optical guide layer 706, resulting in an increased threshold current due to an increased invalid current.

The thickness of each of the impurity-scarce regions 732 and 742 (FIG. 14) of the first and second optical guide layers 704 and 706 is preferably set to, for example, 10 nm or less. When the impurity-scarce region 732 and 742 are excessively thick, the potential barrier inhibits carrier injection from the impurity-doped regions 730 and 740 to the MQW active layer 705. The thickness of 10 nm or less is appropriate for the carriers to tunnel through the potential barrier for realizing smooth carrier injection. When the thickness of the impurity-scarce regions 732 and 742 is less than 3 nm, though, impurities diffuse to the MQW active layer 705 during the operation, thereby deteriorating the laser characteristics. Thus, the lower limit of the thickness of the impurity-scarce regions 732 and 742 is preferably set to 3 nm. When the carrier concentration of the impurity-scarce regions 732 and 742 is ⅕ or less of that of the impurity-doped regions 730 and 740, the impurity-scarce regions 732 and 742 effectively suppress impurity diffusion to the MQW active layer 705 during the operation.

Moreover, the semiconductor laser 700 include the intermediate impurity concentration regions 731, 741 provided between the impurity-doped regions 730, 740 and the impurity-scarce regions 732, 742. Due to such a structure, impurity diffusion from the impurity-doped regions 730, 740 to the MQW active layer 705 during the operation is restricted by both the intermediate impurity concentration regions 731, 741 and the impurity-scarce regions 732, 742. Thus, deterioration of the laser characteristics is more effectively prevented. Moreover, since the height of the potential barrier continuously changes in the intermediate impurity concentration regions 731, 741, the potential barrier is alleviated. In consequence, carrier injection into the MQW active layer 705 is performed more smoothly, realizing the reduced operating voltage. The thickness of the intermediate impurity concentration regions 731, 741 is preferably set to be 3 nm or more but 10 nm or less in order to effectively prevent impurity diffusion from the impurity-doped regions 730, 740 to the impurity-scarce regions 732, 742 during the operation without inhibiting carrier injection from the impurity-doped regions 730, 740 to the MQW active layer 705.

EXAMPLE 8

Figure 17:
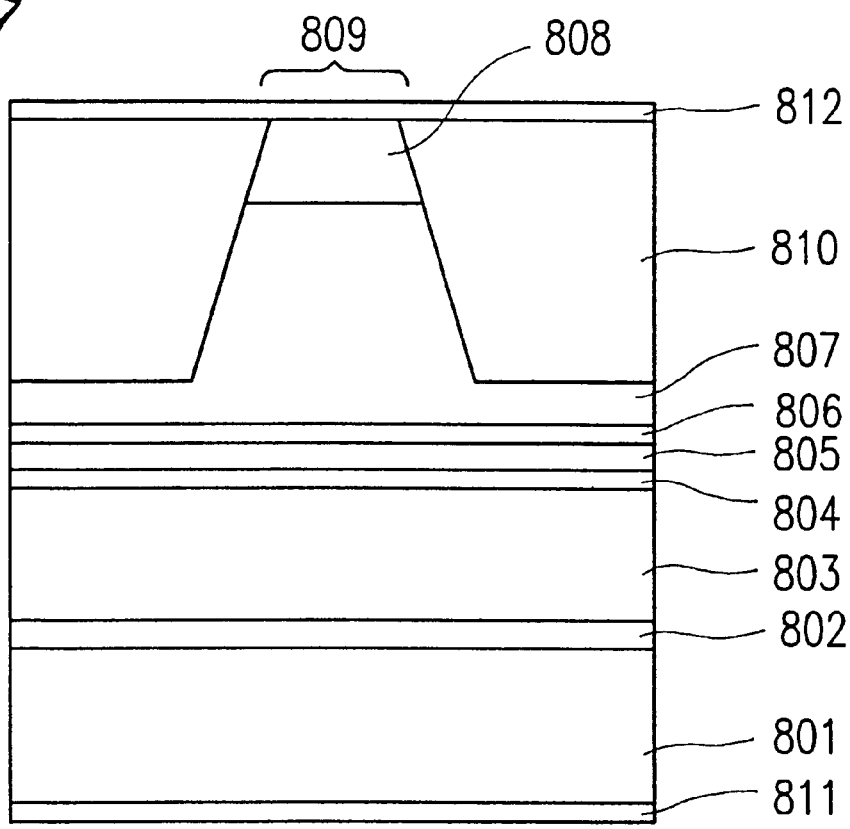
FIG. 17 is a cross-sectional view of a semiconductor laser in an eighth example according to the present invention.
Figure 18:
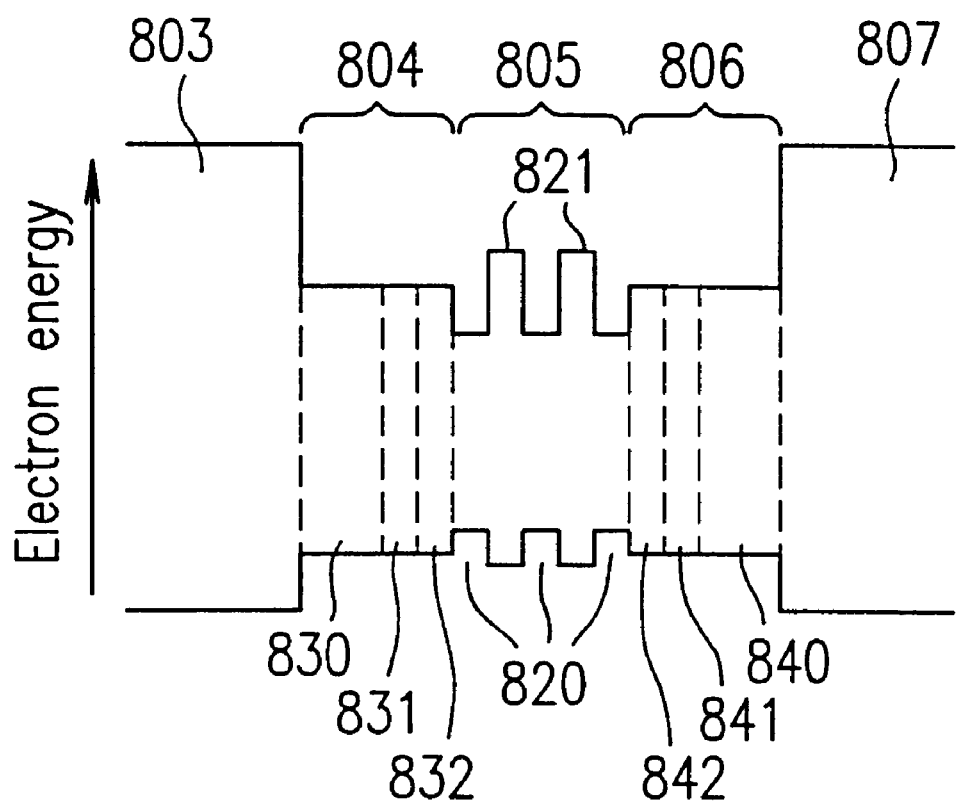
FIG. 18 is an energy band diagram of an active layer and the vicinity thereof of the semiconductor laser shown in FIG. 18.

FIG. 17 is a cross-sectional view of a semiconductor laser 800 in an eighth example according to the present invention, and FIG. 18 is an energy band diagram of an active layer and the vicinity thereof of the semiconductor laser 800. In the eighth example, the forbidden band width of optical guide layers is smaller than that of quantum barrier layers but larger than that of quantum well layers.

As shown in FIG. 17, the semiconductor laser 800 includes an n-type GaAs substrate 801, an n-type Ga$_{0.5}$In$_{0.5}$P buffer layer 802, an n-type (Al$_{0.7}$Ga$_{0.3}$)$_{0.5}$In$_{0.5}$P first cladding layer 803, an (Al$_{0.7}$Ga$_{0.3}$)$_{0.5}$In$_{0.5}$P first optical guide layer 804, a non-doped MQW active layer 805, an (Al$_{0.7}$Ga$_{0.3}$)$_{0.5}$In$_{0.5}$P second optical guide layer 806, and a p-type (Al$_{0.7}$Ga$_{0.3}$)$_{0.5}$In$_{0.5}$P second cladding layer 807. The second cladding layer 807 includes a ridge stripe portion 809 and a flat portion. On the n-type GaAs substrate 801, these layers are sequentially provided. A p-type Ga$_{0.5}$In$_{0.5}$P cap layer 808 is provided on the ridge stripe 809. An n-type GaAs current and light confinement layer 810 is provided on the flat portion of the p-type second cladding layer 807 so as to bury both sides of the ridge stripe 809. A p-side electrode 812 is provided on a surface of the cap layer 808 and a surface of the current confinement layer 810, and an n-side electrode 811 is provided on a surface of the n-type GaAs substrate 801 which does not have the above-described semiconductor layers provided thereon.

The semiconductor laser 800 having the above-described structure is fabricated by, for example, the following manner.

On the n-type GaAs substrate 801, the following layers are grown by MOCVD: the n-type $Ga_{0.5}In_{0.5}P$ buffer layer 802, the n-type $(Al_{0.7}Ga_{0.3})_{0.5}In_{0.5}P$ first cladding layer 803 (thickness: about 1.5 μm), the $(Al_{0.7}Ga_{0.3})_{0.5}In_{0.5}P$ first optical guide layer 804, the non-doped MQW active layer 805, the $(Al_{0.7}Ga_{0.3})_{0.5}In_{0.5}P$ second optical guide layer 806, the p-type $(Al_{0.7}Ga_{0.3})_{0.5}In_{0.5}P$ second cladding layer 807 (thickness: about 1.5 μm), and the p-type $Ga_{0.5}In_{0.5}P$ cap layer 808 (thickness: about 0.3 μm).

As shown in FIG. 18, the MQW active layer 805 is formed by alternately growing three $Ga_{0.5}In_{0.5}P$ quantum well layers 820 each having a thickness of, for example, about 0.008 μm and two $(Al_{0.5}Ga_{0.5})_{0.5}In_{0.5}P$ quantum barrier layers 821 each having a thickness of, for example, about 0.005 μm, so that the barrier layer 821 is interposed between the adjacent well layers 820. The first optical guide layer 804 is formed by sequentially growing an impurity-doped layer (thickness: about 0.015 μm; dopant: Si; carrier concentration: about $7 \times 10^{17}$ cm$^{-3}$) and a non-impurity-doped layer (thickness: about 0.02 μm) on the n-type first cladding layer 803. The second optical guide layer 806 is formed by sequentially growing a non-impurity-doped layer (thickness: about 0.02 μm) and an impurity-doped layer (thickness: about 0.015 μm; dopant: Zn; carrier concentration: about $1 \times 10^{18}$ cm$^{-3}$) on the MQW active layer 805.

The thermal hysteresis temperature (i.e., the crystal grown temperature) during the MOCVD growth process is set to be about 500° C. to 700° C. Due to such a crystal grown temperature, impurities in the first and second optical guide layers 804 and 806 diffuse from the impurity-doped layer to the non-impurity-doped layer. As a result, the MQW active layer 805 and the vicinity thereof exhibits the band diagram shown in FIG. 18.

As can be appreciated from FIG. 18, the first optical guide layer 804 is divided into an impurity-doped region 830 (thickness: about 0.01 μm), an intermediate impurity concentration region 831 (thickness: about 0.015 μm), and an impurity-scarce region 832 (thickness: about 0.01 μm), which are located in this order from the side of the n-type first cladding layer 803. The second optical guide layer 806 is divided into an impurity-doped region 840 (thickness: about 0.01 μm), an intermediate impurity concentration region 841 (thickness: about 0.015 μm), and an impurity-scarce region 842 (thickness: about 0.01 μm), which are located in this order from the side of the p-type second cladding layer 807. In this manner, the impurity-doped regions 830 and 840, the intermediate impurity concentration regions 831 and 841, and the impurity-scarce regions 832 and 842 are formed through a simple fabrication process with satisfactory controllability by thermal hysteresis during the growth of the semiconductor layers.

Returning to FIG. 17, the p-type second cladding layer 807 and the cap layer 808 are etched to form the ridge stripe 809. The etching is performed until a flat portion of the p-type second cladding layer 807 which is not included in the ridge stripe 809 becomes 0.3 μm thick. The resultant ridge stripe 809 has a bottom width of, for example, about 5 μm.

Then, the n-type GaAs current and light confinement layer 810 (thickness: about 1.2 μm) is grown so as to bury both sides of the ridge stripe 809 by MOCVD.

Thereafter, the p-side electrode 812 is formed on the cap layer 808 and the current and light confinement layer 810, and the n-side electrode 811 is formed on the n-type GaAs substrate 801. The cavity length is adjusted to 500 μm by cleaving. Each end of the cavity is treated so that a light reflectance on a light emitting face of the cavity is 50% and a light reflectance on a rear face of the cavity is 85%.

In the semiconductor laser 800 fabricated in this manner, as shown in FIG. 18, the forbidden band width of each of the first and second optical guide layers 804 and 806 is set to be larger than that of the quantum well layers 820 but smaller than that of the quantum barrier layers 821. In general, the Al mole fraction of a compound semiconductor layer including Al is in proportion to the forbidden band width thereof. Accordingly, the Al mole fraction (x=0.3) of the first and second optical guide layers 804 and 806 is set to be higher than the Al mole fraction (x=0) of the quantum well layers 820 but lower than the Al mole fraction (x=0.5) of the quantum barrier layers 821. Such a setting means that the Al mole fraction of the impurity-doped regions 830 and 840 of the first and second optical guide layers 804 and 806 is relatively low. Accordingly, impurity diffusion from the impurity-doped regions 830, 840 to the MQW active layer 805 is further restricted, thereby more effectively preventing deterioration of the laser characteristics.

Such further restriction of deterioration of the laser characteristics is sufficient for preventing the impurity diffusion from the impurity-doped region to the active layer during the operation even when the thickness of the impurity-scarce regions 832 and 842 is reduced. Such a reduction in the thickness allows for smooth current injection from the first and second optical guide layers 804 and 806 to the MQW active layer 805. Thus, the operating voltage is allowed to be lowered.

In general, the forbidden band width of a compound semiconductor layer is in inverse proportion to the refractive index thereof. Accordingly, the above-mentioned structure causes the refractive index of the entire first and second optical guide layers 804 and 806 to be increased so as to enhance the light confinement, thereby lowering the threshold current.

When a forward voltage was applied between the n-side electrode 811 and the p-side electrode 812 of the semiconductor laser 800, an operating current of 35 mA and an operating voltage of 2 V were obtained under the conditions of an oscillating wavelength of 0.65 μm, a threshold current of 30 mA, a slope efficiency of current vs. optical output characteristic of 0.6 W/A, and an optical output of 3 mW. In contrast, a semiconductor laser including no impurity in the optical guide layers exhibited a higher operating voltage of 2.3 V. In the case of a semiconductor laser including impurities in the entirety of the optical guide layers, the operating voltage was 2 V but the operating current was as large as 50 mA due to impurity diffusion from the optical guide layers to the MQW active layer during the operation. Thus, the semiconductor laser 800 in the eighth example reduces the operating voltages and also prevents deterioration of the laser characteristics otherwise caused by an increased operating current.

EXAMPLE 9

In a ninth example according to the present invention, the forbidden band width of optical guide layers is set to be smaller than that of quantum barrier layers but larger than that of quantum well layers. The forbidden band width of impurity-scarce regions is set to be larger than that of impurity-doped regions.

A semiconductor laser in the ninth example has substantially the same structure as that of the semiconductor laser 800 shown in FIG. 17. Elements which are identical with those described with reference to FIGS. 17 and 18 bear identical reference numerals and detailed descriptions thereof will be omitted.

As in the eighth example, due to thermal hysteresis during the grown process, impurities in the first and second optical guide layers 804 and 806 diffuse from the impurity-doped layer to the non-impurity-doped layer. As a result, the MQW active layer 805 and the vicinity thereof exhibits the band diagram shown in FIG. 19.

Figure 19:
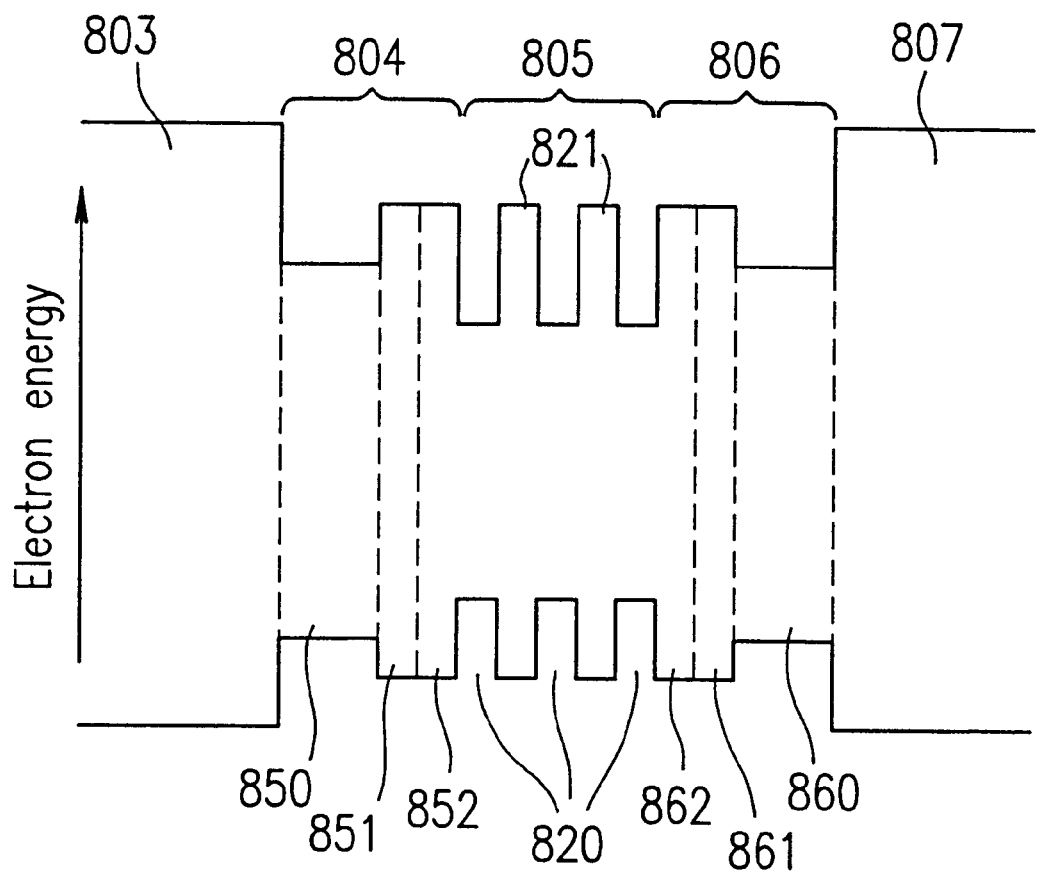
FIG. 19 is an energy band diagram of an active layer and the vicinity thereof of a semiconductor laser in a ninth example according to the present invention.

As can be appreciated from FIG. 19, the first optical guide layer 804 is divided into an impurity-doped region 850 (thickness: about 0.01 μm), an intermediate impurity concentration region 851 (thickness: about 0.015 μm), and an impurity-scarce region 852 (thickness: about 0.01 μm), which are located in this order from the side of the n-type first cladding layer 803. The second optical guide layer 806 is divided into an impurity-doped region 860 (thickness: about 0.01 μm), an intermediate impurity concentration region 861 (thickness: about 0.015 μm), and an impurity-scarce region 862 (thickness: about 0.01 μm), which are located in this order from the side of the p-type second cladding layer 807. In this manner, the impurity-doped regions 850 and 860, the intermediate impurity concentration regions 851 and 861, and the impurity-scarce regions 852 and 862 are formed through a simple fabrication process with satisfactory controllability by thermal hysteresis during the growth of the semiconductor layers.

In the ninth example, the Al mole fraction of each of the impurity-doped region 850 of the first optical guide layer 804 and the impurity-doped region 860 of the second optical guide layer 806 is set to be at 0.2 or 0.3, which is higher than the Al mole fraction (x=0) of the quantum well layers 820 but lower than the Al mole fraction (x=0.5) of the quantum barrier layers 821. In other words, as shown in FIG. 19, the forbidden band width of each of the impurity-doped regions 850 and 860 is larger than that of the quantum well layers 820 but smaller than that of the quantum barrier layers 821. On the other hand, the Al mole fraction (x=0.5) of each of the impurity-scarce regions 852 and 862 in the first and second optical guide layers 804 and 806 is set to be higher than the Al mole fraction (x=0.2 or 0.3) of the impurity-doped regions 850 and 860 therein. In other words, as shown in FIG. 19, the forbidden band width of each of the impurity-scarce regions 852 and 862 is set to be larger than that of the impurity-doped regions 850 and 860. In this manner, the Al mole fraction of each of the impurity-doped regions 850 and 860 is set to be still lower than in the eighth example by performing carrier confinement into the MQW active layer 805 with the impurity-scarce regions 852 and 862. Accordingly, impurity diffusion from the impurity-doped regions 850 and 860 to the MQW active layer 805 is further reduced compared to the eighth example, thereby more effectively preventing deterioration of the laser characteristics.

Figure 20:
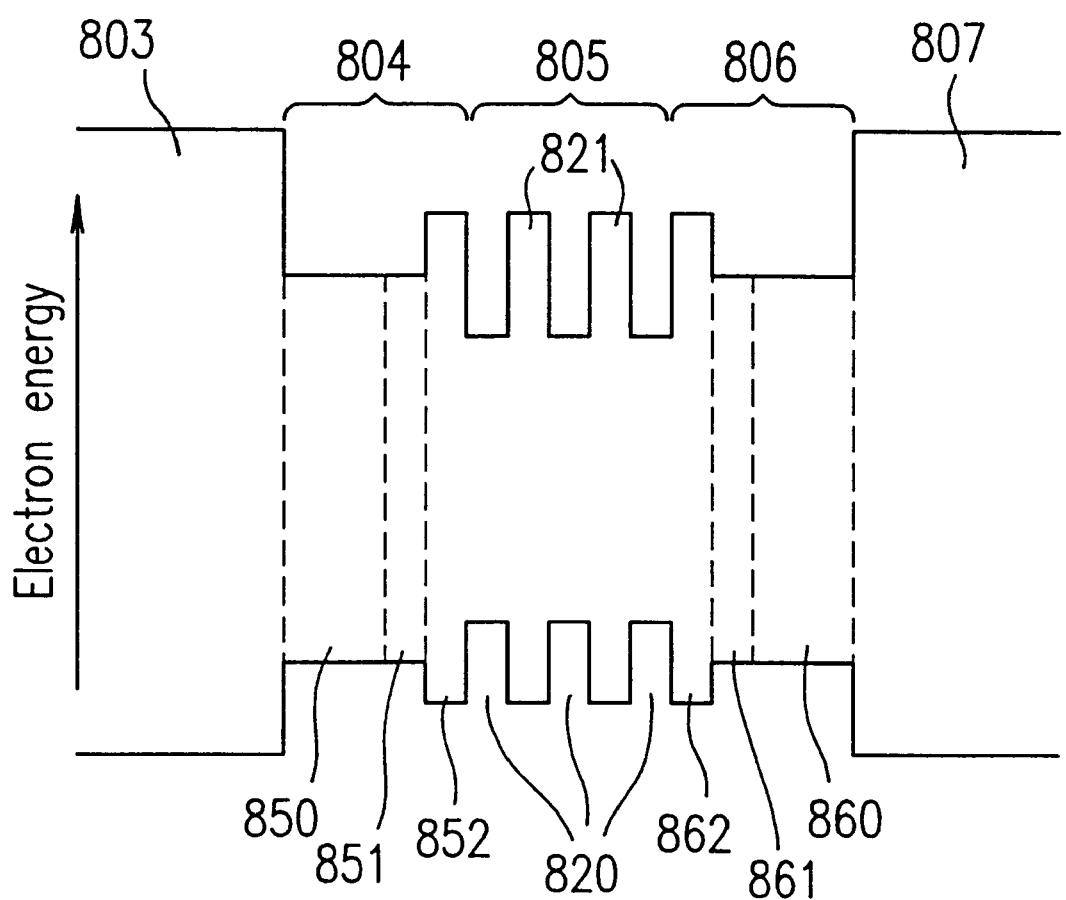
FIG. 20 is an energy band diagram of an active layer and the vicinity thereof of an another semiconductor laser in accordance with the ninth example of the present invention.

In the ninth example, it is sufficient as long as the forbidden band width of the impurity-doped regions 850 and 860 is set to be larger than that of the quantum well layers 820 but smaller than that of the quantum barrier layers 821. The forbidden band width of the intermediate impurity concentration regions 851 and 861 can be equal to that of the impurity-scarce regions 852 and 862 as shown in FIG. 19 or equal to that of the impurity-doped regions 850 and 860 as shown in FIG. 20. Alternatively, the forbidden band width of the intermediate impurity concentration regions 851 and 861 can be at an intermediate level between the forbidden band width of the impurity-scarce regions 852 and 862 and that of the impurity-doped regions 850 and 860.

The AlGaInP-type materials described in the eighth and ninth examples are more likely to allow impurities to diffuse than the AlGaAs-type materials. Thus, it is particularly effective to apply the present invention to those materials since the invention can effectively reduce impurity diffusion from the impurity-doped regions to the MQW active layer.

EXAMPLE 10

A tenth example according to the present invention relates to a light emitting diode.

Figure 21:
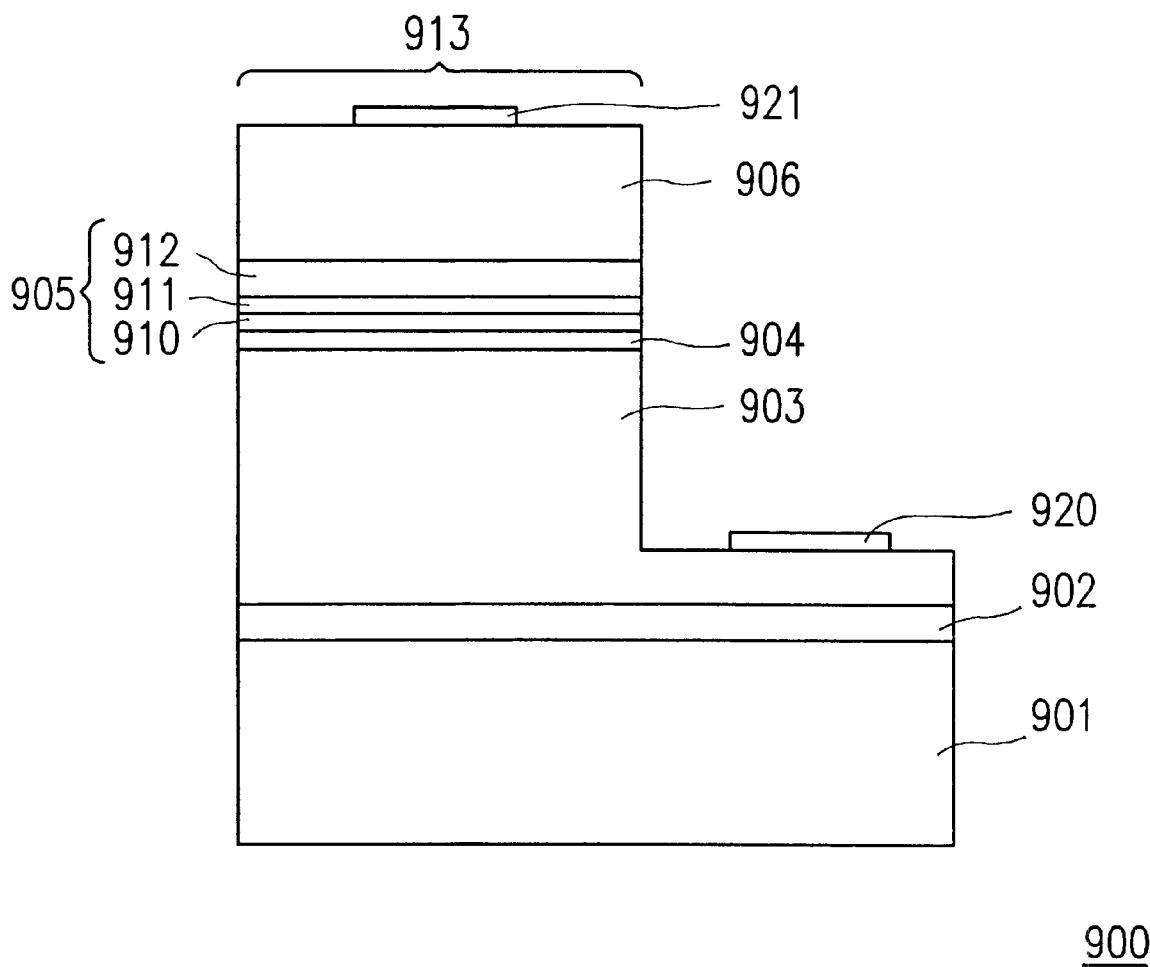
FIG. 21 is a cross-sectional view of a light emitting diode in a tenth example according to the present invention.

FIG. 21 is a cross-sectional view of a light emitting diode 900 in the tenth example according to the present invention.

As shown in FIG. 21, the light emitting diode 900 includes a sapphire substrate 901, a GaN buffer layer 902, an n-type GaN first cladding layer 903, a non-doped single quantum well (hereinafter, referred to as "SQW") active layer 904, a p-type $Al_{0.2}Ga_{0.8}N$ second cladding layer 905, and a p-type GaN contact layer 906. On the sapphire substrate 901, these layers are sequentially provided. The n-type first cladding layer 903, the non-doped SQW active layer 904, the second cladding layer 905, and the p-type contact layer 906 are formed into a mesa stripe 913 with the n-type first cladding layer 903 being partially exposed. An n-side electrode 920 is provided on the exposed surface of the n-type first cladding layer 903, and a p-side electrode 921 is provided on the contact layer 906.

The light emitting diode 900 is fabricated by, for example, the following manner.

On the sapphire substrate 901, the following layers are grown by MOCVD: the GaN buffer layer 902 (thickness: about 0.05 μm), the n-type GaN first cladding layer 903 (thickness: about 3 μm; dopant: Si; carrier concentration: about $5 \times 10^{17}$ cm$^{-3}$), the non-doped SQW active layer 904, the $Al_{0.2}Ga_{0.8}N$ second cladding layer 905, and the p-type GaN contact layer 906 (thickness: about 0.2 μm; dopant: Mg; carrier concentration: about $5 \times 10^{17}$ cm$^{-3}$).

The SQW active layer 904 is formed by growing a single layer $Ga_{0.2}In_{0.8}P$ (thickness: about 0.003 μm). The second cladding layer 905 is formed by sequentially growing a non-impurity-doped layer (thickness: about 0.03 μm) and an impurity-doped layer (thickness: about 0.07 μm; dopant: Mg; carrier concentration: about $5 \times 10^{17}$ cm$^{-3}$) on the SQW active layer 904.

The thermal hysteresis temperature (i.e., the crystal grown temperature) during the MOCVD growth process is set to be about 900° C. to 1100° C. Due to such a crystal grown temperature, impurities in the second cladding layer 905 diffuse from the impurity-doped layer to the non-impurity-doped layer. As a result, the second cladding layer 905 is divided into an impurity-scarce region 910 (thickness: about 0.01 μm), an intermediate impurity concentration region 911 (thickness: about 0.04 μm), and an impurity-doped region 912 (thickness: about 0.05 μm), which are located in this order from the side of the SQW active layer 904. In this manner, the impurity-doped region 912, the intermediate impurity concentration region 911 and the impurity-scarce region 910 are formed through a simple fabrication process with satisfactory controllability by thermal hysteresis during the growth of the semiconductor layers.

Thereafter, a circular resist mask is formed on the contact layer 906 and the mesa stripe 913 is formed by dry etching. Then, the n-side electrode 920 is formed on the exposed surface of the n-type first cladding layer 903, and the p-side electrode 921 is formed on the contact layer 906.

In the light emitting diode 900, the impurity-scarce region 910 is provided between the impurity-doped region 912 of the p-type second cladding layer 905. Since a p-type impurity has a larger diffusion coefficient than that of an n-type impurity, in this example, the operating voltage can be reduced and thus deterioration of the diode characteristics can be prevented by suppressing impurity (Mg) diffusion from the impurity-doped region 912 of the p-type second cladding layer 905 to the SQW active layer 904 at the impurity-scarce region 910. Since the diode characteristics can be optimized simply by controlling the thickness of the impurity-scarce region 910 of the p-type second cladding layer 905, the light emitting diode 900 can be relatively easily designed.

When a forward voltage was applied between the n-side electrode 920 and the p-side electrode 921 of the light emitting diode 900, a light emitting wavelength of 0.45 µm, an operating current of 50 mA and an operating voltage of 4.5 V were obtained. Moreover, since impurity diffusion from the activated second cladding layer 905 to the SQW active layer 904 is suppressed, deterioration of the diode characteristics is prevented. In the case of a light emitting diode containing impurities in the entire second cladding layer, the operating voltage is 4.5 V but the diode characteristics are deteriorated during the operation. As can be appreciated from the comparison, the light emitting diode 900 in the tenth example prevents deterioration of the diode characteristics without increasing the operating voltage.

Since the InGaN-type materials described in the tenth example has a higher growth temperature (i.e., 1000° C.±100° C.) compared to the growth temperature (600° C. to 700° C.) of the AlGaAs-type and AlGaInP-type materials, and thus has a higher degree of impurity diffusion. Thus, it is particularly effective to apply the present invention to those materials since the invention can effectively reduce impurity diffusion from the cladding layer to the active layer.

EXAMPLE 11

In a light emitting diode in an eleventh example according to the present invention, a p-type cladding layer and an n-type cladding layer each include an impurity-scarce region adjacent to an active layer.

Figure 22:
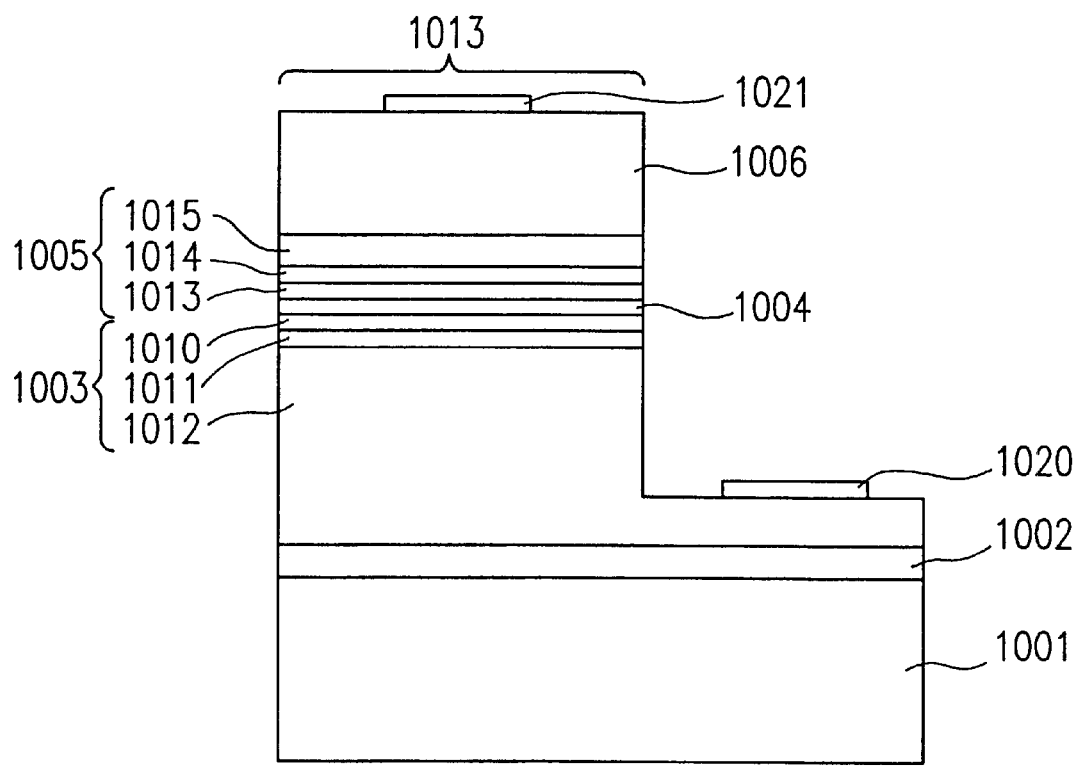
FIG. 22 is a cross-sectional view of a light emitting diode in an eleventh example according to the present invention.
Figure 23:
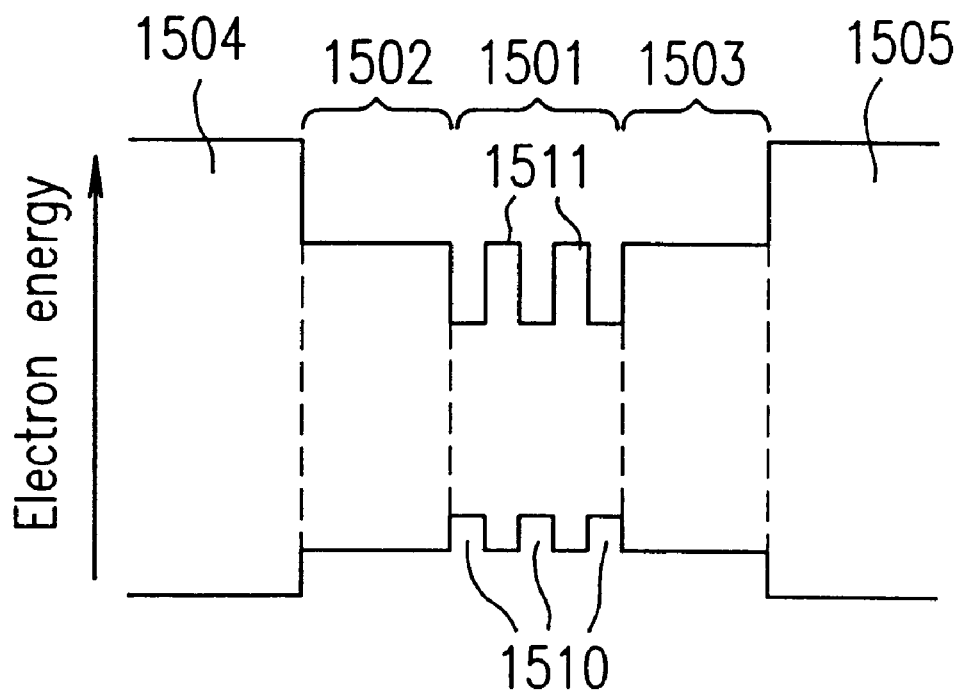
FIG. 23 is an energy band diagram of an active layer and the vicinity thereof of a conventional semiconductor laser.

FIG. 22 is a cross-sectional view of a light emitting diode 1000 in the eleventh example according to the present invention.

As shown in FIG. 22, the light emitting diode 1000 includes a sapphire substrate 1001, a GaN buffer layer 1002, an n-type GaN first cladding layer 1003, a non-doped SQW active layer 1004, a p-type $Al_{0.2}Ga_{0.8}N$ second cladding layer 1005, and a p-type GaN contact layer 1006. On the sapphire substrate 1001, these layers are sequentially provided. The n-type first cladding layer 1003, the non-doped SQW active layer 1004, the second cladding layer 1005, and the p-type contact layer 1006 are formed into a mesa stripe 1013 with the n-type first cladding layer 1003 being partially exposed. An n-side electrode 1020 is provided on the exposed surface of the n-type first cladding layer 1003, and a p-side electrode 1021 is provided on the contact layer 1006.

The light emitting diode 1000 is fabricated by, for example, the following manner.

On the sapphire substrate 1001, the following layers are grown by MOCVD: the GaN buffer layer 1002 (thickness: about 0.05 µm), the n-type GaN first cladding layer 1003, the non-doped SQW active layer 1004, the $Al_{0.2}Ga_{0.8}N$ second cladding layer 1005, and the p-type GaN contact layer 1006 (thickness: about 0.2 µm; dopant: Mg; carrier concentration: about $5\times10^{17}$ $cm^{-3}$).

The SQW active layer 1004 is formed by growing a single layer $Ga_{0.2}In_{0.8}P$ (thickness: about 0.003 µm). The n-type first cladding layer 1003 is formed by sequentially growing a non-impurity-doped layer (thickness: 0.03 µm) and an impurity-doped layer (thickness: about 2.97 µm; dopant: Si; carrier concentration: about $5\times10^{18}$ $cm^{-3}$) on the SQW active layer 1004. The p-type second cladding layer 1005 is formed by sequentially growing a non-impurity-doped layer (thickness: about 0.05 µm) and an impurity-doped layer (thickness: about 0.05 µm; dopant: Mg; carrier concentration: about $5\times10^{17}$ $cm^{-3}$) on the SQW active layer 1004.

The thermal hysteresis temperature (i.e., the crystal grown temperature) during the MOCVD growth process is set to be at about 900° C. to 1100° C. Due to such a crystal grown temperature, impurities in the first cladding layer 1003 diffuse from the impurity-doped layer to the non-impurity-doped layer. As a result, the first cladding layer 1003 is divided into an impurity-scarce region 1010 (thickness: about 0.01 µm), an intermediate impurity concentration region 1011 (thickness: about 0.02 µm), and an impurity-doped region 1012 (thickness: about 2.97 µm), which are located in this order from the side of the SQW active layer 1004. Impurities in the second cladding layer 1005 also diffuse from the impurity-doped layer to the non-impurity-doped layer. As a result, the second cladding layer 1005 is divided into an impurity-scarce region 1013 (thickness: about 0.02 µm), an intermediate impurity concentration region 1014 (thickness: about 0.04 µm), and an impurity-doped region 1015 (thickness: about 0.04 µm), which are located in this order from the side of the SQW active layer 1004. In this manner, the impurity-doped regions 1012 and 1015, the intermediate impurity concentration region 1011 and 1014, and the impurity-scarce region 1010 and 1013 are formed through a simple fabrication process with satisfactory controllability by thermal hysteresis during the growth of the semiconductor layers.

Thereafter, the n-type first cladding layer 1003 is partially exposed by etching. Then, the n-side electrode 1020 is formed on the exposed surface of the n-type first cladding layer 1003, and the p-side electrode 1021 is formed on the contact layer 1006.

In the light emitting diode 1000, the impurity-scarce region 1013 of the p-type second cladding layer 1005 is made thicker than the impurity-scarce region 1010 of the n-type first cladding layer 1003. Since a p-type impurity has a larger diffusion coefficient than that of an n-type impurity, the impurity-scarce regions 1010 and 1013 are allowed to have a desired thickness. In other words, since thicknesses of the impurity-scarce regions 1010 and 1013 are adjustable in accordance with the diffusion coefficient, the enhanced freedom of design is obtained for reducing the operating voltage and preventing deterioration of the diode characteristics.

When a forward voltage was applied between the n-side electrode 1020 and the p-side electrode 1021 of the light emitting diode 1000, a light emitting wavelength of 0.45 µm, an operating current of 50 mA and an operating voltage of 4.5 V were obtained.

The present invention is not limited to the above-described examples and is applicable to other semiconductor light-emitting devices which are different from the devices in the previous examples in terms of the structure of a quantum well active layer (for example, the number, the composition ratio or the thickness of the wells, etc.), thicknesses, Al mole fractions, types of dopant, the carrier concentration and the like for the respective layers.

Growth methods other than MOCVD or MBE, such as, for example, LPE, MOMBE (Metal Organic Molecular Beam Epitaxy), ALE are usable.

In addition, in the previous examples, an intermediate impurity concentration region is formed by impurity diffusion from the impurity-doped layer to the non-impurity-doped layer. Alternatively, the intermediate impurity concentration region can be formed by growing a separate semiconductor layer. The growth temperature of an intermediate impurity concentration region can be set at an appropriate temperature which is lower than that of the active layer by about 50° C. to 200° C. in order to control the impurity diffusion.

The present invention is applicable to semiconductor devices containing materials other than the materials described above.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light-emitting device, comprising:

a first doped guide layer including Al;

a second doped guide layer including Al; and an active layer interposed between the first doped guide layer and the second doped guide layer, the active layer having a multiple quantum well structure including a plurality of quantum well layers and a quantum barrier layer interposed between the adjacent quantum well layers, wherein the quantum barrier layer includes Al, wherein the first doped guide layer and the second doped guide layer are disposed to be adjacent to the quantum well layers, the first doped guide layer and the second doped guide layer have a forbidden band width which is larger than a forbidden band width of the quantum well layers, the forbidden band width of at least one of the first guide layer and the second guide layer is smaller than a forbidden band width of the quantum barrier layer, and the Al composition ratio of the first and second guide layers is smaller than the Al composition ratio of the quantum barrier layer.

2. A light-emitting device according to claim 1, further comprising:

a first cladding layer having a first conductivity type and a second cladding layer having a second conductivity type, the first cladding layer and the second cladding layer interposing the first guide layer and the second guide layer therebetween; and a saturable absorption layer provided between the first cladding layer and the second cladding layer, the saturable absorption layer having a light emitting energy of a level substantially equal to an energy of a laser oscillation light of the active layer.

3. A light-emitting device according to claim 1, further comprising:

a first cladding layer having a first conductivity type and a second cladding layer having a second conductivity type, the first cladding layer and the second cladding layer interposing the first guide layer and the second guide layer therebetween;

a third cladding layer having the second conductivity type and provided outside the second cladding layer, the third cladding layer being disposed on the opposite side to the first cladding layer with respect to the second cladding layer; and a saturable absorption layer provided between the first cladding layer and the third cladding layer, the saturable absorption layer having a light emitting energy of a level substantially equal to an energy of a laser oscillation light of the active layer.

4. A light-emitting device according to claim 1, further comprising:

a first cladding layer having a first conductivity type and a second cladding layer having a second conductivity type, the first cladding layer and the second cladding layer interposing the first guide layer and the second guide layer therebetween; and a striped third cladding layer having the second conductivity type and provided outside the second cladding layer, the striped third cladding layer being disposed on the opposite side to the first cladding layer with respect to the second cladding layer, wherein a difference $\Delta n$ between a refractive index $n_a$ of light confined in a first portion of the active layer which is covered by the striped third cladding layer and a refractive index $n_b$ of light confined in a second portion of the active layer which is not covered by the striped third cladding layer fulfills expression (1):

$$2\times10^{-3} \leq \Delta n \leq 7\times10^{-3} \tag{1}$$

5. A light-emitting device according to claim 1, wherein the second cladding layer having the second conductivity type is a p-type cladding layer, the second guide layer is disposed on the same side as the p-type cladding layer with respect to the active layer, and the forbidden band width of the second guide layer is smaller than the forbidden band width of the quantum barrier layer.

6. A light-emitting device according to claim 1, wherein the smaller one of the forbidden band width of the first guide layer and that of the second guide layer is larger than a forbidden band width value corresponding to an energy of a laser oscillation light of the active layer.

7. A light-emitting device according to claim 6, wherein Eg, Eb and E$\lambda$ fulfill expression (2) where Eg is the smaller one of the forbidden band width of the first guide layer and that of the second guide layer, Eb is the forbidden band width of the quantum barrier layer, and E$\lambda$ is the forbidden band width value corresponding to the energy of the laser oscillation light energy of the active layer:

$$E\lambda+100 \text{ meV} \leq Eg \leq Eb-50 \text{ meV} \tag{2}$$

8. A light-emitting device of a semiconductor laser element formed as a layered structure of a plurality of layers, comprising:

a substrate;

a buffered layer disposed on the substrate;

a cladding layer disposed on the buffer layer;

a doped optical guide layer disposed on the cladding layer;

an active layer disposed on the doped optical guide layer;

a cap layer disposed on the cladding layer;

an n-type electrode provided on the surface of the substrate; and a p-type electrode disposed on the cap layer;

wherein one or more of particular layers in the layered structure includes an impurity-scarce region and an impurity-doped region within each layer of the one or more particular layers, and the impurity-scarce region is disposed closer to the active layer than the impurity-doped region.

9. A light-emitting device according to claim 8, further comprising a pair of cladding layers interposing the active layer therebetween, wherein the one or more particular layers include at least one of the pair of cladding layers.

10. A light-emitting device according to claim 8, further comprising a pair of optical guide layers interposing the active layer therebetween, and wherein the one or more particular layers include at least one of the pair of optical guide layers.

11. A light-emitting device according to claim 8, further comprising an optical guide layer disposed on either side of the active layer, wherein the one or more particular layers includes the optical guide layer.

12. A light-emitting device according to claim 8, further comprising an intermediate impurity concentration region disposed between the impurity-scarce region and the impurity-doped region.

13. A light-emitting device according to claim 8, wherein the active layer includes a quantum well layer.

14. A light-emitting device according to claim 8, wherein the one or more particular layers is an optical guide layer, and the impurity-doped region contains a p-type impurity at a carrier concentration of $4 \times 10^{17}$ cm$^{-3}$ or more and $1.2 \times 10^{18}$ cm$^{-3}$ or less.

15. A light-emitting device according to claim 8, wherein the one or more particular layers is an optical guide layer, and the impurity-doped region contains an n-type impurity at a carrier concentration of $2 \times 10^{17}$ cm$^{-3}$ or more and $1 \times 10^{18}$ cm$^{-3}$ or less.

16. A light-emitting device according to claim 8, wherein an impurity concentration of the impurity-scarce region is less than or equal to ⅕ of an impurity concentration of the impurity-doped region.

17. A light-emitting device according to claim 8, wherein the impurity-scarce region has a thickness between 3 nm and 10 nm.

18. A light-emitting device according to claim 8, wherein the impurity-scarce region is included in at least one of a p-type cladding layer and a p-type optical guide layer.

19. A light-emitting device according to claim 8, wherein the layered structure includes a p-type cladding layer and an n-type cladding layer interposing the active layer, and the impurity-scarce region is provided in each of the p-type cladding layer and the n-type cladding layer, wherein the impurity-scarce region in the p-type cladding layer has greater thickness than the impurity-scarce region in the n-type cladding layer.

20. A light-emitting device according to claim 8, wherein the layered structure includes a p-type optical guide layer and an n-type optical guide layer interposing the active layer, and the impurity-scarce region is provided in each of the p-type optical guide layer and the n-type optical guide layer, wherein the impurity-scarce region in the p-type optical guide layer is thicker than the impurity-scarce region in the n-type optical guide layer.

21. A light-emitting device according to claim 12, wherein the intermediate impurity concentration region has a thickness between 3 nm and 10 nm.

22. A light-emitting device according to claim 8, the active layer further comprising a multiple quantum well structure including a plurality of quantum well layers and a barrier layer interposed by adjacent quantum well layers, and wherein a forbidden band width of at least the impurity-doped region of the one or more particular layers is less than a forbidden band width of the barrier layer and greater than a forbidden band width of the quantum well layers.

23. A light-emitting device according to claim 22, wherein the forbidden band width of the impurity-doped region is less than the forbidden band width of the impurity-scarce region.

24. A light-emitting device according to claim 8, wherein the one or more particular layers are formed of a material selected from the group consisting of AlGaAs type materials, AlGaInP type materials and InGaN type materials.

* * * * *